US012402296B2

(12) United States Patent
Sakui et al.

(10) Patent No.: US 12,402,296 B2
(45) Date of Patent: *Aug. 26, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 167 days.

This patent is subject to a terminal disclaimer.

(21) Appl. No.: 18/228,852

(22) Filed: Aug. 1, 2023

(65) Prior Publication Data

US 2023/0389274 A1 Nov. 30, 2023

Related U.S. Application Data

(63) Continuation-in-part of application No. PCT/JP2021/003726, filed on Feb. 2, 2021.

(51) Int. Cl.
*G11C 11/404* (2006.01)
*G06F 12/02* (2006.01)
(Continued)

(52) U.S. Cl.
CPC ......... *H10B 12/20* (2023.02); *G06F 12/0246* (2013.01); *G11C 11/404* (2013.01); *G11C 11/4096* (2013.01); *G06F 2212/7201* (2013.01)

(58) Field of Classification Search
CPC ................. H10B 12/20; G06F 12/2046; G06F 2212/7201; G11C 11/404; G11C 11/4096
See application file for complete search history.

(56) References Cited

U.S. PATENT DOCUMENTS 10,228,878 B1 * 3/2019 Mateescu .............. G06F 3/0679
11,990,204 B2 * 5/2024 Sakui .................... G11C 11/404
(Continued)

FOREIGN PATENT DOCUMENTS

JP H02188966 A 7/1990
JP H03171768 A 7/1991
(Continued)

OTHER PUBLICATIONS

Written Opinion of the International Searching Authority in International Application No. PCT/JP2021/003726, dated Mar. 30, 2021 (3 pages).

(Continued)

*Primary Examiner* — Min Huang
(74) *Attorney, Agent, or Firm* — Crowell & Moring LLP

(57) ABSTRACT

A semiconductor element memory device is configured to perform a data hold operation of controlling voltages to be applied to a plate line, a word line, a source line, and a bit line to hold, in a semiconductor base, a positive hole group formed by an impact ionization phenomenon or a gate-induced drain leakage current, and a data erase operation of controlling voltages to be applied to the plate line, the word line, the source line, and the bit line to discharge the positive hole group from the semiconductor base. The semiconductor element memory device includes a plurality of memory cells arranged in a matrix within a block, and constantly manages, using a controller circuit and a logical/physical conversion table, which physical block address of a dynamic flash memory corresponds to data stored in a logical block address.

15 Claims, 16 Drawing Sheets

(51) Int. Cl.
*G11C 11/4096* (2006.01)
*H10B 12/00* (2023.01)

(56) References Cited

U.S. PATENT DOCUMENTS

| | | | | |
|---|---|---|---|---|
| 2006/0049444 | A1 | 3/2006 | Shino | |
| 2008/0212366 | A1 | 9/2008 | Ohsawa | |
| 2012/0092925 | A1* | 4/2012 | Chen | H10D 30/711 365/182 |
| 2014/0159114 | A1* | 6/2014 | Zheng | H10D 30/0413 438/585 |
| 2020/0159674 | A1* | 5/2020 | Morgan | G06F 12/0238 |
| 2021/0193661 | A1* | 6/2021 | Lee | H10B 12/00 |
| 2022/0406780 | A1* | 12/2022 | Sakui | G11C 11/4091 |
| 2022/0406781 | A1* | 12/2022 | Sakui | G11C 11/406 |
| 2023/0377635 | A1* | 11/2023 | Sakui | H10B 12/00 |
| 2023/0377636 | A1* | 11/2023 | Sakui | H10D 30/021 |
| 2023/0380138 | A1* | 11/2023 | Sakui | H10B 12/20 |

FOREIGN PATENT DOCUMENTS

| | | |
|---|---|---|
| JP | 2006-80280 A | 3/2006 |
| JP | H3957774 | 5/2007 |
| JP | 2008-218556 A | 9/2008 |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel 4F$^2$ DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti—doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using a One-Transistor Gain Cell on SOI", *IEEE Journal of Solid-State Circuits*, vol. 37, No. 11, Nov. 2022, pp. 1510-1522 (13 pages).

Shino, T., et al., "Floating Body RAM Technology and its Scalability to 32nm Node and Beyond", IEEE IEDM (2006) (4 pages).

Yoshida, E., et al., "A Design of a Capacitorless 1T-DRAM Cell Using Gate-induced Drain Leakage (GIDL) Current for Low-power and High-speed Embedded Memory" IEEE IEDM, pp. 913-916, Dec. 2003 (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Staked Nanosheet Gate-All-Around Transistor to Enable Scaling Beyond FinFET" *2017 Symposium on VLSI Technology Digest of Technical Papers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

* cited by examiner

FIG. 2A

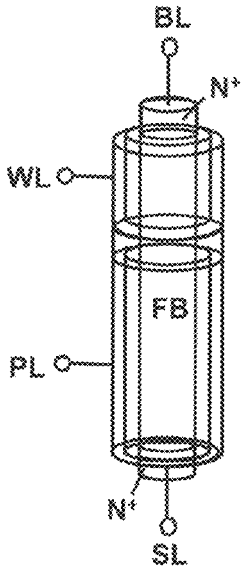

FIG. 2B

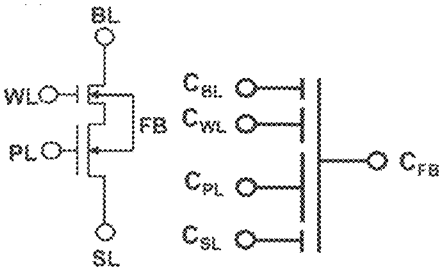

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2)$$ ⇨ SMALL $\beta_{WL}$ $$\beta_{PL} = \frac{C_{PL}}{C_{WL} + C_{PL} + C_{BL} + C_{SL}} \quad (3)$$ ⇨ LARGE $\beta_{PL}$ $$\beta_{BL} = \frac{C_{BL}}{C_{WL} + C_{PL} + C_{BL} + C_{SL}} \quad (4)$$ ⇨ SMALL $\beta_{BL}$ $$\beta_{SL} = \frac{C_{SL}}{C_{WL} + C_{PL} + C_{BL} + C_{SL}} \quad (5)$$ ⇨ SMALL $\beta_{SL}$

FIG. 2C

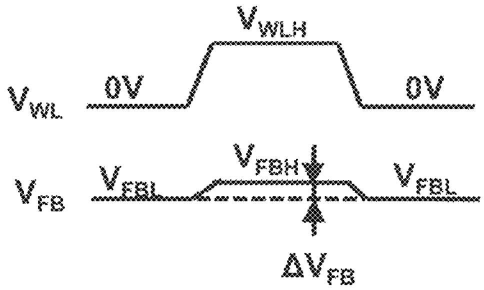

$$\Delta V_{FB} = V_{FBH} - V_{FBL}$$

$$= \underline{\underline{\beta_{WL} \times V_{WLH}}} \quad (6)$$

SMALL

FIG. 3A
"1" WRITE OPERATION
SOURCE-SIDE IMPACT IONIZATION
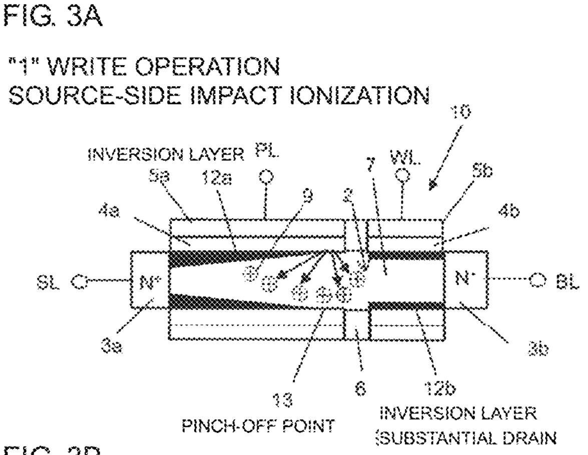
FIG. 3B
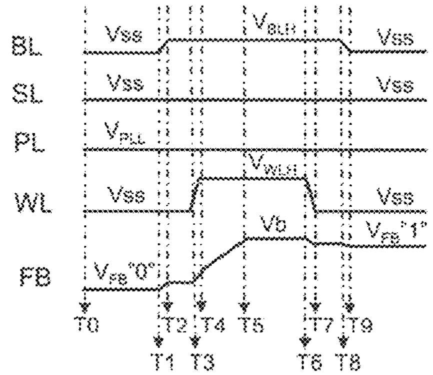
$$V_{FB}\text{"1"} = Vb - \underline{\underline{\beta_{WL} \times Vt_{WL}\text{"1"} - \beta_{BL} \times V_{BLH}}} \quad (7)$$
SMALL
FIG. 3C "1" WRITE STATE
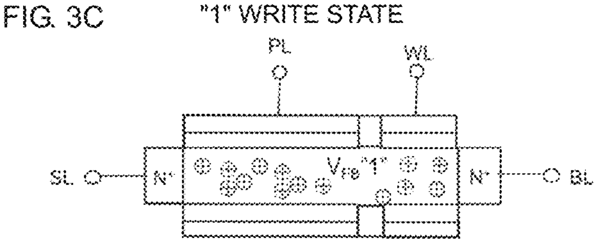
FIG. 3D CELL CURRENT
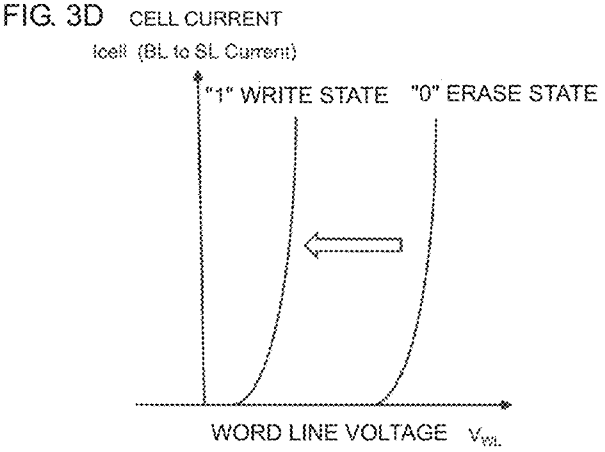

FIG. 4AA
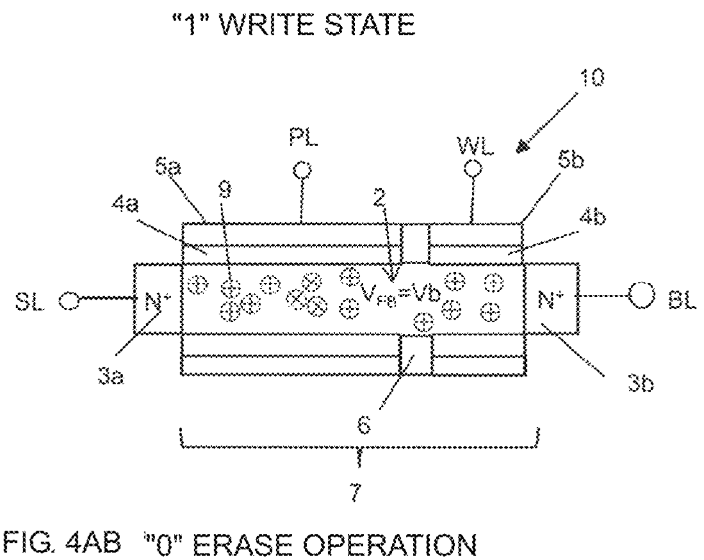
FIG. 4AB "0" ERASE OPERATION
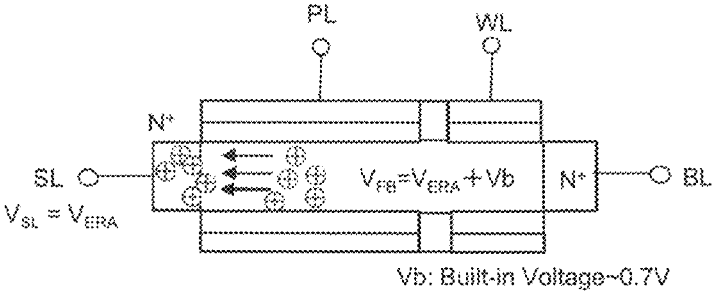
FIG. 4AC
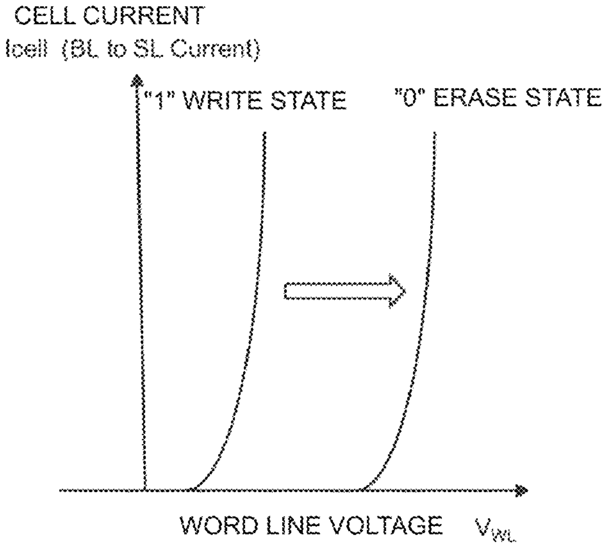

FIG. 4B

ERASE OPERATION

| | SIGNAL LINE | APPLIED VOLTAGE |
|---|---|---|
| "0" ERASE | BIT LINE BL | Vss (e.g.: 0V) |
| | SOURCE LINE SL | $V_{ERA}$ (e.g.: -3V) |
| | PLATE LINE PL | $V_{PLL}$ (e.g.: 2V) |
| | WORD LINE WL | Vss (e.g.: 0V) |
| | FLOATING BODY FB | $V_{ERA}$ + Vb (e.g.: -3V + 0.7V = -2.3V) |

Vb: BUILT-IN VOLTAGE OF PN JUNCTION 0.7 V

"1" WRITE STATE

"0" ERASE STATE

Vb: BUILT-IN VOLTAGE 0.7 V

FIG. 6B

BLOCK ERASE

| SELECTION/ NON-SELECTION | SIGNAL LINE | APPLIED VOLTAGE |
|---|---|---|
| BLOCK OF "0" ERASE | BIT LINE BL | $V_{SS}$ (e.g.: 0V) |
| | SOURCE LINE SL | $V_{ERA}$ (e.g.: -3V) |
| | PLATE LINE PL | $V_{PLL}$ (e.g.: 2V) |
| | WORD LINE WL | $V_{SS}$ (e.g.: 0V) |
| | FLOATING BODY FB | $V_{ERA}$ + Vb (e.g.: -3V+0.7V = -2.3V) |
| BLOCK OF NON-ERASE (BLOCK IN WHICH RECORDED DATA IS TO BE MAINTAINED) | BIT LINE BL | $V_{SS}$ (e.g.: 0V) |
| | SOURCE LINE SL | $V_{SS}$ (e.g.: 0V) |
| | PLATE LINE PL | $V_{PLL}$ (e.g.: 2V) |
| | WORD LINE WL | $V_{SS}$ (e.g.: 0V) |
| | FLOATING BODY FB | $V_{SS}$ (e.g.: 0V) |

FIG. 7A

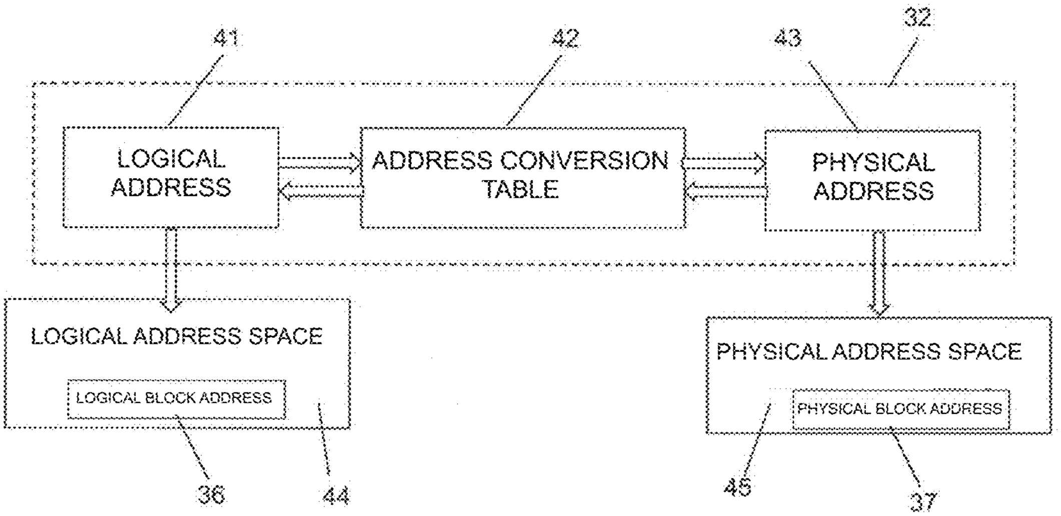

$$C_{FB} = C_{WL} + C_{BL} + C_{SL} \quad (8)$$

$$\beta_{WL} = \frac{C_{WL}}{C_{WL} + C_{BL} + C_{SL}} \quad (9)$$

$$\Delta V_{FB} = V_{FB2} - V_{FB1}$$
$$= \beta_{WL} \times V_{WLH} \quad (10)$$

SEMICONDUCTOR ELEMENT MEMORY DEVICE

CROSS REFERENCES TO RELATED APPLICATIONS

The present application is a Continuation-In-Part application of PCT/JP2021/003726, filed Feb. 2, 2021, the entire contents of which are incorporated herein by reference.

BACKGROUND OF THE INVENTION

1. Field of the Invention

The present invention relates to a semiconductor memory device including a semiconductor element.

2. Description of the Related Art

In recent years, a higher degree of integration and a higher performance of memory elements have been demanded in the development of the large scale integration (LSI) technology.

In a typical planar metal oxide semiconductor (MOS) transistor, a channel extends in a horizontal direction along an upper surface of a semiconductor substrate. In contrast, in a surrounding gate transistor (SGT), a channel extends in a vertical direction with respect to an upper surface of a semiconductor substrate (see, for example, Japanese Unexamined Patent Application Publication No. 2-188966; and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, compared with the planar MOS transistor, the SGT is capable of increasing the density of a semiconductor device. With use of the SGT as a selection transistor, a higher degree of integration can be achieved in a dynamic random access memory (DRAM) to which a capacitor is connected (see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)), a phase change memory (PCM) to which a resistance change element is connected (see, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No. 12, December, pp. 2201-2227 (2010)), a resistive random access memory (RRAM) (see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)), a magneto-resistive random access memory (MRAM) in which a resistance is changed by changing the orientation of a magnetic spin by using a current (see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)), and so forth. In addition, there is a capacitorless DRAM memory cell constituted by a single MOS transistor (see J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)). The present application relates to a dynamic flash memory that does not include a resistance change element or a capacitor and that can be constituted by a MOS transistor alone.

FIGS. 8A to 8D illustrate a write operation of the above-described capacitorless DRAM memory cell constituted by a single MOS transistor, FIGS. 9A and 9B illustrate a problem in the operation, and FIGS. 10A to 10C illustrate a read operation (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajina, M. Morikado, K. Inoh, T. Hamamoto, A. Nitayama: "Floating Body RAM Technology and its Scalability to 32 nm Node and Beyond," IEEE IEDM (2003); and E. Yoshida and T. Tanaka: "A Design of Capacitorless 1T-DRAM Cell Using Gate-Induced Drain-Leakage (GIDL) Current for Low-Power and High-Speed Embedded Memory," IEEE IEDM (2006)). FIG. 8A illustrates a "1" write state. A memory cell 110 is formed on an SOI substrate 100 and is constituted by a source $N^+$ layer 103 (hereinafter, a semiconductor region containing donor impurities at high concentration will be referred to as an "$N^+$ layer") connected to a source line SL, a drain $N^+$ layer 104 connected to a bit line BL, a gate conductive layer 105 connected to a word line WL, and a floating body 102 of a MOS transistor. The single MOS transistor constitutes the DRAM memory cell 110 having no capacitor. A $SiO_2$ layer 101 of the SOI substrate 100 is immediately under the floating body 102 and is in contact with the floating body 102. To write "1" in the memory cell 110 constituted by the single MOS transistor, the MOS transistor is operated in a saturation region. That is, an electron channel 107 extending from the source $N^+$ layer 103 has a pinch-off point 108 and does not reach the drain $N^+$ layer 104 connected to the bit line BL. When the MOS transistor is operated such that the bit line BL connected to the drain $N^+$ layer 104 and the word line WL connected to the gate conductive layer 105 are both at a high voltage and that the gate voltage is about ½ of the drain voltage, the electric field strength becomes maximum at the pinch-off point 108 near the drain $N^+$ layer 104. As a result, accelerated electrons flowing from the source $N^+$ layer 103 toward the drain $N^+$ layer 104 collide with a Si lattice, and the kinetic energy lost at the time generates electron-hole pairs. Most of the generated electrons (not illustrated) reach the drain $N^+$ layer 104. A very small portion of the electrons, which is very hot, jumps over a gate oxide film 109 and reaches the gate conductive layer 105. Positive holes 106 generated simultaneously charge the floating body 102. In this case, the generated positive holes 106 contribute as an increment of a majority carrier because the floating body 102 is made of P-type Si. When the floating body 102 is filled with the generated positive holes 106 and the voltage of the floating body 102 becomes higher than that of the source $N^+$ layer 103 by Vb or more, positive holes further generated are discharged to the source $N^+$ layer 103. Vb herein is a built-in voltage of the PN junction between the source $N^+$ layer 103 and the floating body 102 as a P layer, and is about 0.7 V. FIG. 8B illustrates a state in which the floating body 102 is charged to saturation with the generated positive holes 106.

Next, a "0" write operation of the memory cell 110 will be described with reference to FIG. 8C. For a selected common word line WL, there are randomly a memory cell 110 for writing "1" and a memory cell 110 for writing "0". FIG. 8C illustrates a state of rewriting from a "1" write state to a "0" write state. To write "0", the voltage of the bit line BL is negatively biased, and the PN junction between the drain $N^+$ layer 104 and the floating body 102 as a P layer is forward biased. As a result, the positive holes 106 generated in the floating body 102 in advance in the previous cycle flow into the drain $N^+$ layer 104 connected to the bit line BL. Upon completion of the write operation, two memory cell states are obtained: the memory cell 110 filled with the generated positive holes 106 (FIG. 8B); and the memory cell 110 from which the generated positive holes 106 have been discharged (FIG. 8C). The floating body 102 of the memory cell 110 filled with the positive holes 106 has a potential higher than that of the floating body 102 having no generated positive holes. Thus, a threshold voltage of the memory cell 110 to write "1" is lower than a threshold voltage of the memory cell 110 to write "0". This state is illustrated in FIG. 8D.

Next, a problem in the operation of the memory cell 110 constituted by the single MOS transistor will be described with reference to FIGS. 9A and 9B. As illustrated in FIG. 9A, a capacitance $C_{FB}$ of the floating body 102 is the sum of a capacitance $C_{WL}$ between the gate connected to the word line and the floating body 102, a junction capacitance $C_{SL}$ of the PN junction between the source $N^+$ layer 103 connected to the source line and the floating body 102, and a junction capacitance $C_{BL}$ of the PN junction between the drain $N^+$ layer 104 connected to the bit line and the floating body 102, and is expressed as follows.

$$C_{FB}=C_{WL}+C_{BL}+C_{SL} \quad (8)$$

A capacitive coupling ratio $\beta_{WL}$ between the gate connected to the word line and the floating body 102 is expressed as follows.

$$\beta_{WL}=C_{WL}/(C_{WL}+C_{BL}+C_{SL}) \quad (9)$$

Thus, if a word line voltage $V_{WL}$ oscillates at the time of reading or writing, the oscillation affects the voltage of the floating body 102 serving as a storage node (contact point) of the memory cell. This state is illustrated in FIG. 9B. In accordance with an increase in the word line voltage $V_{WL}$ from 0 V to $V_{WLH}$ at the time of reading or writing, a voltage $V_{FB}$ of the floating body 102 increases from a voltage $V_{FB1}$ in an initial state before the word line voltage changes to a voltage $V_{FB2}$ due to capacitive coupling with the word line. The amount of voltage change $\Delta V_{FB}$ is expressed as follows.

$$\begin{aligned}\Delta V_{FB} &= V_{FB2} - V_{FB1} \\ &= \beta_{WL} \times V_{WLH}\end{aligned} \quad (10)$$

In $\beta_{WL}$ in equation (9), $C_{WL}$ has a high contribution ratio, for example, $C_{WL}$:$C_{BL}$:$C_{SL}$=8:1:1. In this case, 0 equals 0.8. When the word line changes, for example, from 5 V at the time of writing to 0 V after the end of writing, the capacitive coupling between the word line WL and the floating body 102 causes the floating body 102 to be subjected to oscillation noise of 5 V×$\beta_{WL}$=4 V. This involves a problem that a sufficient potential difference margin is not provided between the "1" potential and the "0" potential of the floating body 102 at the time of writing.

FIGS. 10A to 10C illustrate a read operation, in which FIG. 10A illustrates a "1" write state, and FIG. 10B illustrates a "0" write state. Actually, however, even if Vb is written in the floating body 102 by "1" writing, the floating body 102 is lowered to a negative bias when the word line returns to 0 V upon completion of writing. "0" writing causes a deeper negative bias, and thus a sufficiently large potential difference margin between "1" and "0" is not obtained at the time of writing, as illustrated in FIG. 10C. Thus, it has been difficult to commercialize a capacitorless DRAM memory cell.

SUMMARY OF THE INVENTION

A capacitorless single-transistor DRAM (gain cell) has a problem that oscillation of the potential of the word line at the time of reading or writing data is directly transmitted as noise to the floating body because the capacitive coupling between the word line and the floating body is large. This results in a problem of erroneous reading or erroneous rewriting of stored data, and difficulty in putting a capacitorless single-transistor DRAM (gain cell) into practical use.

To solve the above problems, a semiconductor element memory device according to the present invention includes a block including a plurality of semiconductor memory cells arranged in a matrix, each semiconductor memory cell including a semiconductor element, the semiconductor element including:

a semiconductor base standing on a substrate in a vertical direction with respect to the substrate or extending on the substrate in a horizontal direction with respect to the substrate;

a first impurity region and a second impurity region at both ends of the semiconductor base;

a gate insulating layer that is in contact with a side surface of the semiconductor base between the first impurity region and the second impurity region;

a first gate conductor layer that covers a part or an entirety of the gate insulating layer; and a second gate conductor layer that is adjacent to the first gate conductor layer and that is in contact with a side surface of the gate insulating layer, wherein the semiconductor element memory device is configured to control voltages to be applied to the first gate conductor layer, the second gate conductor layer, the first impurity region, and the second impurity region to hold, inside the semiconductor base, a positive hole group formed by an impact ionization phenomenon or a gate-induced drain leakage current, perform a memory write operation of causing the semiconductor base to have a first data retention voltage, perform a memory erase operation of controlling voltages to be applied to the first impurity region, the second impurity region, the first gate conductor layer, and the second gate conductor layer to discharge a residual positive hole group of the positive hole group from either or both of the first impurity region and the second impurity region and to cause the semiconductor base to have a second data retention voltage lower than the first data retention voltage, perform, during the memory erase operation, a block erase operation on all the semiconductor bases in the block, the block erase operation being an operation of discharging the positive hole group from either or both of the first impurity region and the second impurity region, and mutually convert a physical address and a logical address of the block by using a logical/physical conversion table provided inside or outside the semiconductor element memory device (first invention).

In the above-described first invention, the semiconductor element memory device includes a physical address space constituted by the physical address, and a logical address space constituted by the logical address, wherein the physical address space is larger than the logical address space (second invention).

In the above-described second invention, the logical address space is constituted by a binary number (third invention).

In the above-described first invention, the logical/physical conversion table is constituted by the logical address, an address conversion table, and the physical address (fourth invention).

In the above-described first invention, the logical/physical conversion table is managed by a controller circuit, and either or both of the logical/physical conversion table and the controller circuit are provided inside or outside the semiconductor element memory device (fifth invention).

In the above-described second invention, rewriting of data in a first block of the logical address space is performed for a second block having a physical address different from a physical address of the first block, and the second block having the physical address is registered, in the logical/physical conversion table, as a new first block of the logical address space (sixth invention).

In the above-described first invention, in each semiconductor memory cell included in the block, a source line is connected to the first impurity region, a bit line is connected to the second impurity region, a word line is connected to one of the first gate conductor layer and the second gate conductor layer, and a first drive control line is connected to an other of the first gate conductor layer and the second gate conductor layer, and the semiconductor element memory device is configured to selectively perform the memory erase operation and the memory write operation by applying voltages to the source line, the bit line, the first drive control line, and the word line (seventh invention).

In the above-described seventh invention, in each semiconductor memory cell included in the block, the bit line is orthogonal to the word line in plan view (eighth invention).

In the above-described first invention, in each semiconductor memory cell included in the block, a first gate capacitance between the first gate conductor layer and the semiconductor base is larger than a second gate capacitance between the second gate conductor layer and the semiconductor base (ninth invention).

In the above-described ninth invention, the first gate capacitance is larger than the second gate capacitance as a result of the first and second gate conductor layers having different channel lengths, as a result of the first and second gate insulating layers having different thicknesses, or as a result of the first and second gate insulating layers having different relative permittivities (tenth invention).

In the above-described first invention, each semiconductor memory cell included in the block includes the semiconductor base formed perpendicular to the substrate, the first impurity region formed in the semiconductor base and disposed near the substrate, a first semiconductor base formed in the semiconductor base and disposed above the first impurity region, a second semiconductor base formed in the semiconductor base and disposed above the first semiconductor base, the second impurity region formed in the semiconductor base and disposed above the second semiconductor base, a first gate insulating layer surrounding the first semiconductor base, a second gate insulating layer surrounding the second semiconductor base, the first gate conductor layer surrounding the first gate insulating layer, the second gate conductor layer surrounding the second gate insulating layer, and a first insulating layer disposed between the first gate conductor layer and the second gate conductor layer (eleventh invention).

In the above-described first invention, either or both of the first gate conductor layer and the second gate conductor layer are divided into two or more isolated gate conductor layers in plan view or in the vertical direction, and the isolated gate conductor layers are operated synchronously or asynchronously (twelfth invention).

In the above-described twelfth invention, in the vertical direction, the isolated gate conductor layers of one of the first gate conductor layer and the second gate conductor layer are disposed on both sides of an other of the first gate conductor layer and the second gate conductor layer (thirteenth invention).

BRIEF DESCRIPTION OF THE DRAWINGS

FIGS. 2A, 2B, and 2C are diagrams for describing an effect obtained when the gate capacitance of a first gate conductor layer connected to a plate line is larger than the gate capacitance of a second gate conductor layer connected to a word line in the memory device including an SGT according to the first embodiment;

FIGS. 3A, 3B, 3C, and 3D are diagrams for describing a write operation mechanism of the memory device including an SGT according to the first embodiment;

FIGS. 4AA, 4AB, and 4AC are diagrams for describing an erase operation mechanism of the memory device including an SGT according to the first embodiment;

FIG. 4B is diagram for describing an erase operation mechanism of the memory device including an SGT according to the first embodiment;

FIG. 6B is a diagram for describing the block erase operation of the memory device including an SGT according to the first embodiment;

FIG. 7A is a diagram for describing a block rewrite operation and a block erase operation of the memory device including an SGT according to the first embodiment;

DESCRIPTION OF THE PREFERRED EMBODIMENTS

Hereinafter, a semiconductor element memory device (hereinafter also referred to as a dynamic flash memory) according to an embodiment of the present invention will be described with reference to the drawings.

First Embodiment

Figure 1:
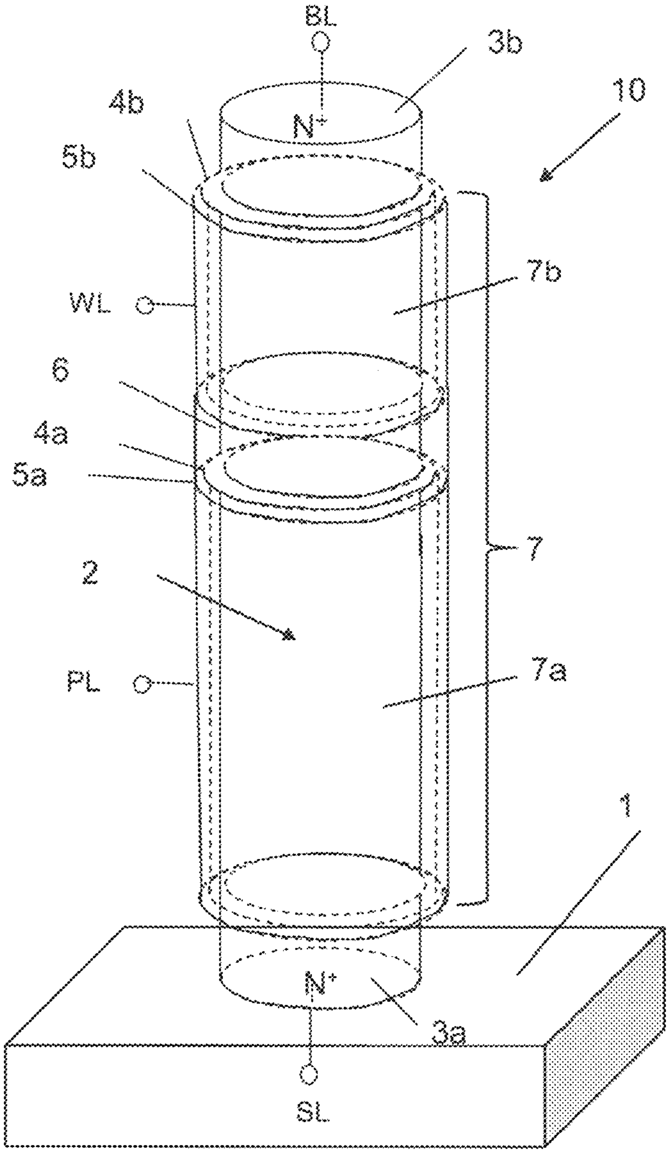
FIG. 1 is a structural diagram of a memory device including an SGT according to a first embodiment.
Figure 5A:
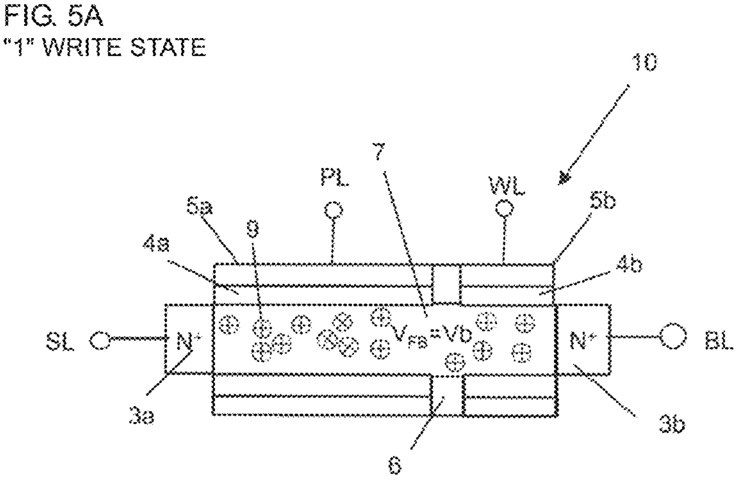
FIGS. 5A, 5B, and 5C are diagrams for describing a read operation mechanism of the memory device including an SGT according to the first embodiment.
Figure 5B:
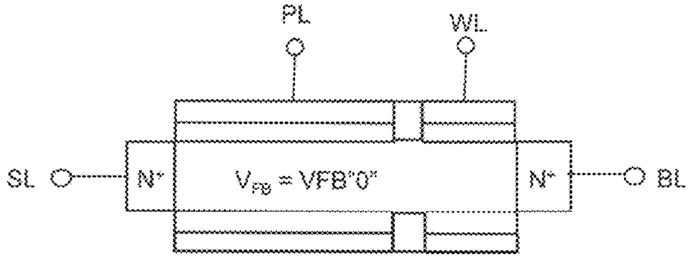
Figure 5C:
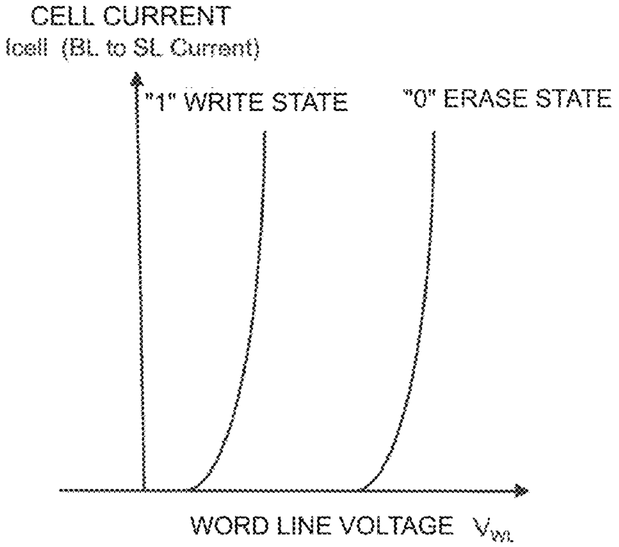

The structure and operation mechanism of a dynamic flash memory cell according to a first embodiment of the present invention will be described with reference to FIG. 1, FIGS. 2A to 2C, FIGS. 3A to 3D, FIGS. 4AA to 4AC, FIG. 4B, and FIGS. 5A to 5C. With reference to FIG. 1, a description will be given of the structure of the dynamic flash memory cell. With reference to FIGS. 2A to 2C, a description will be given of an effect obtained when the gate capacitance of a first gate conductor layer 5*a* connected to a plate line PL is larger than the gate capacitance of a second gate conductor layer 5*b* connected to a word line WL. With reference to FIGS. 3A to 3D, a description will be given of a data write operation mechanism. With reference to FIGS. 4AA to 4AC and FIG. 4B, a description will be given of a data erase operation mechanism. With reference to FIGS. 5A to 5C, a description will be given of a data read operation mechanism.

FIG. 1 illustrates the structure of the dynamic flash memory cell according to the first embodiment of the present invention. At lower and upper positions in a silicon semiconductor pillar 2 (Hereinafter a silicon semiconductor pillar will be referred to as a "Si pillar") having a conductivity type of P type or i type (intrinsic type) and formed on a substrate 1 (an example of "substrate" in the claims), an $N^+$ layer 3*a* (an example of "first impurity region" in the claims) and an $N^+$ layer 3*b* (an example of "second impurity region" in the claims) are formed, one of which serves as a source and the other of which serves as a drain. A portion of the Si pillar 2 between the $N^+$ layers 3*a* and 3*b* serving as the source and drain is a semiconductor base 7 (an example of "semiconductor base" in the claims). A first gate insulating layer 4*a* (an example of "first gate insulating layer" in the claims) and a second gate insulating layer 4*b* (an example of "second gate insulating layer" in the claims) are formed so as to surround the semiconductor base 7. The first gate insulating layer 4*a* and the second gate insulating layer 4*b* are respectively in contact with or close to the $N^+$ layer 3*a* and the $N^+$ layer 3*b* serving as the source and drain. A first gate conductor layer 5*a* (an example of "first gate conductor layer" in the claims) and a second gate conductor layer 5*b* (an example of "second gate conductor layer" in the claims) are formed so as to respectively surround the first gate insulating layer 4*a* and the second gate insulating layer 4*b*. The first gate conductor layer 5*a* and the second gate conductor layer 5*b* are isolated from each other by an insulating layer 6 (an example of "first insulating layer" in the claims). The semiconductor base 7, which is a portion of the Si pillar 2 between the $N^+$ layers 3*a* and 3*b*, is formed of a first channel Si layer 7*a* (an example of "first semiconductor base" in the claims) surrounded by the first gate insulating layer 4*a* and a second channel Si layer 7*b* (an example of "second semiconductor base" in the claims) surrounded by the second gate insulating layer 4*b*. Accordingly, a dynamic flash memory cell 10 formed of the $N^+$ layers 3*a* and 3*b* serving as the source and drain, the semiconductor base 7, the first gate insulating layer 4*a*, the second gate insulating layer 4*b*, the first gate conductor layer 5*a*, and the second gate conductor layer 5*b* is formed. The $N^+$ layer 3*a* serving as the source is connected to a source line SL (an example of "source line" in the claims), the $N^+$ layer 3*b* serving as the drain is connected to a bit line BL (an example of "bit line" in the claims), the first gate conductor layer 5*a* is connected to a plate line PL serving as a first drive control line (an example of "first drive control line" in the claims), and the second gate conductor layer 5*b* is connected to a word line WL (an example of "word line" in the claims). In a desired structure, the gate capacitance of the first gate conductor layer 5*a* connected to the plate line PL is larger than the gate capacitance of the second gate conductor layer 5*b* connected to the word line WL.

In FIG. 1, the gate length of the first gate conductor layer 5*a* is made larger than the gate length of the second gate conductor layer 5*b* so that the gate capacitance of the first gate conductor layer 5*a* connected to the plate line PL is larger than the gate capacitance of the second gate conductor layer 5*b* connected to the word line WL. Alternatively, instead of making the gate length of the first gate conductor layer 5*a* larger than the gate length of the second gate conductor layer 5*b*, the gate insulating film of the first gate insulating layer 4*a* may be made thinner than the gate insulating film of the second gate insulating layer 4*b* by changing the film thicknesses of the respective gate insulating layers. Alternatively, the permittivity of the gate insulating film of the first gate insulating layer 4*a* may be made higher than the permittivity of the gate insulating film of the second gate insulating layer 4*b* by changing the permittivities of the materials of the respective gate insulating layers. The gate capacitance of the first gate conductor layer 5*a* connected to the plate line PL may be made larger than the gate capacitance of the second gate conductor layer 5*b* connected to the word line WL by combining the lengths of the gate conductor layers 5*a* and 5*b* and the film thicknesses or permittivities of the gate insulating layers 4*a* and 4*b*.

FIGS. 2A to 2C are diagrams for describing an effect obtained when the gate capacitance of the first gate conductor layer 5*a* connected to the plate line PL is larger than the gate capacitance of the second gate conductor layer 5*b* connected to the word line WL.

FIG. 2A schematically illustrates only a main part of the structure of the dynamic flash memory cell according to the first embodiment of the present invention. The bit line BL, the word line WL, the plate line PL, and the source line SL are connected to the dynamic flash memory cell, and the voltage state thereof determines the potential state of the semiconductor base 7.

FIG. 2B is a diagram for describing the respective capacitance relationships. A capacitance $C_{FB}$ of the semiconductor base 7 is the sum of a capacitance $C_{WL}$ between the second gate conductor layer 5*b* connected to the word line WL and the semiconductor base 7, a capacitance $C_{PL}$ between the first gate conductor layer 5*a* connected to the plate line PL and the semiconductor base 7, a junction capacitance $C_{SL}$ of the PN junction between the $N^+$ layer 3*a* connected to the source line SL and the semiconductor base 7, and a junction capacitance $C_{BL}$ of the PN junction between the $N^+$ layer 3*b* connected to the bit line BL and the semiconductor base 7, and is expressed as follows.

$$C_{FB}=C_{WL}+C_{PL}+C_{BL}+C_{SL} \quad (1)$$

Thus, a coupling ratio $\beta_{WL}$ between the word line WL and the semiconductor base 7, a coupling ratio $\beta_{WL}$ between the plate line PL and the semiconductor base 7, a coupling ratio $\beta_{BL}$ between the bit line BL and the semiconductor base 7, and a coupling ratio $\beta_{SL}$ between the source line SL and the semiconductor base 7 are expressed as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, $C_{PL}>C_{WL}$ holds, and thus $\beta_{PL}>\beta_{WL}$ holds.

FIG. 2C is a diagram for describing a change in a voltage $V_{FB}$ of the semiconductor base 7 when a voltage $V_{WL}$ of the word line WL rises and then drops in a read operation and a write operation. Here, when the voltage $V_{WL}$ of the word line WL rises from 0 V to a high voltage state $V_{WLH}$, a potential difference $\Delta V_{FB}$ between a low voltage state $V_{FBL}$ and a high voltage state $V_{FBH}$ of the voltage $V_{FB}$ of the semiconductor base 7 is expressed as follows.

$$\begin{aligned}\Delta V_{FB} &= V_{FBH} - V_{FBL} \\ &= \beta_{WL} \times V_{WLH}\end{aligned} \quad (6)$$

The coupling ratio $\beta_{WL}$ between the word line WL and the semiconductor base 7 is small and the coupling ratio $\beta_{PL}$ between the plate line PL and the semiconductor base 7 is large. Thus, $\Delta V_{FB}$ is small, and the voltage $V_{FB}$ of the semiconductor base 7 hardly changes even if the voltage $V_{WL}$ of the word line WL rises and drops in a read operation and a write operation.

FIGS. 3A to 3D illustrate a write operation of the dynamic flash memory cell according to the first embodiment of the present invention. FIG. 3A illustrates a mechanism of a write operation, and FIG. 3B illustrates operation waveforms of the bit line BL, the source line SL, the plate line PL, the word line WL, and the semiconductor base 7 serving as a floating body FB. At time T0, the dynamic flash memory cell is in a "0" erase state, and the voltage of the semiconductor base 7 is $V_{FB}$ "0". A voltage Vss is applied to the bit line BL, the source line SL, and the word line WL, whereas a voltage $V_{PLL}$ is applied to the plate line PL. Here, for example, the voltage Vss is 0 V and the voltage $V_{PLL}$ is 2 V. When the voltage of the bit line BL rises from Vss to $V_{BLH}$ from time T1 to time T2, for example, in a case where the voltage Vss is 0 V, the voltage of the semiconductor base 7 becomes $V_{FB}$ "0"+$\beta_{BL}\times V_{BLH}$ due to the capacitive coupling between the bit line BL and the semiconductor base 7.

The write operation of the dynamic flash memory cell will be further described with reference to FIGS. 3A and 3B. From time T3 to time T4, the voltage of the word line WL rises from Vss to $V_{WLH}$. Accordingly, when a "0" erase threshold voltage $Vt_{WL}$ of a second N-channel MOS transistor region in which the second gate conductor layer 5*b* connected to the word line WL surrounds the semiconductor base 7 is "0", the voltage of the semiconductor base 7 becomes $V_{FB}$ "0"+$\beta_{BL}\times V_{BLH}$+$\beta_{WL}\times Vt_{WL}$ "0" due to the capacitive coupling between the word line WL and the semiconductor base 7 from Vss to $Vt_{WL}$ "0" as the voltage of the word line WL rises. When the voltage of the word line WL rises to $Vt_{WL}$ "0" or more, an annular inversion layer 12*b* is formed in the semiconductor base 7 on an inner side from the second gate conductor layer 5*b*, interrupting second capacitive coupling between the word line WL and the semiconductor base 7.

The write operation of the dynamic flash memory cell will be further described with reference to FIGS. 3A and 3B. From time T3 to time T4, for example, $V_{PLL}$=2 V is fixedly input to the first gate conductor layer 5*a* connected to the plate line PL, and the voltage of the second gate conductor layer 5*b* connected to the word line WL rises to, for example, $V_{WLH}$=4 V. As a result, as illustrated in FIG. 3A, an annular inversion layer 12*a* is formed in the semiconductor base 7 on an inner side from the first gate conductor layer 5*a* connected to the plate line PL. The inversion layer 12*a* has a pinch-off point 13. As a result, a first N-channel MOS transistor region including the first gate conductor layer 5*a* operates in a saturation region. On the other hand, the second N-channel MOS transistor region including the second gate conductor layer 5*b* connected to the word line WL operates in a linear region. As a result, a pinch-off point is absent in the inversion layer on an inner side from the second gate conductor layer 5*b* connected to the word line WL, and the inversion layer 12*b* is formed over the entire surface. The inversion layer 12*b* formed over the entire surface on the inner side from the second gate conductor layer 5*b* connected to the word line WL substantially functions as the drain of the second N-channel MOS transistor region including the second gate conductor layer 5*b*. As a result, the electric field becomes maximum in a first boundary region of the semiconductor base 7 between the first N-channel MOS transistor region including the first gate conductor layer 5*a* and the second N-channel MOS transistor region including the second gate conductor layer 5*b* that are connected in series, and an impact ionization phenomenon occurs in this region. This region is a region on the source side when viewed from the second N-channel MOS transistor region including the second gate conductor layer 5*b* connected to the word line WL, and thus this phenomenon is referred to as a source-side impact ionization phenomenon. The source-side impact ionization phenomenon causes electrons to flow from the $N^+$ layer 3*a* connected to the source line SL toward the $N^+$ layer 3*b* connected to the bit line BL. Accelerated electrons collide with lattice Si atoms, and the kinetic energy thereof generates electron-hole pairs. Some of the generated electrons flow to the first gate conductor layer 5*a* and the second gate conductor layer 5*b*, but most of the electrons flow to the $N^+$ layer 3*b* connected to the bit line BL (not illustrated).

As illustrated in FIG. 3C, a generated positive hole group 9 (an example of "positive hole group" in the claims) is a majority carrier in the semiconductor base 7 and charges the semiconductor base 7 to a positive bias. The $N^+$ layer 3*a* connected to the source line SL is at 0 V, and thus the semiconductor base 7 is charged to a built-in voltage Vb (about 0.7 V) of the PN junction between the $N^+$ layer 3*a* connected to the source line SL and the semiconductor base 7. Upon the semiconductor base 7 being charged to a positive bias, the threshold voltages of the first N-channel MOS transistor region and the second N-channel MOS transistor region are decreased by a substrate bias effect.

The write operation of the dynamic flash memory cell will be further described with reference to FIG. 3B. From time T6 to time T7, the voltage of the word line WL drops from $V_{WLH}$ to Vss. At this time, second capacitive coupling occurs between the word line WL and the semiconductor base 7, but the inversion layer 12*b* blocks the second capacitive coupling until the voltage $V_{WLH}$ of the word line WL becomes equal to or lower than the threshold voltage $Vt_{WL}$ "1" of the second N-channel MOS transistor region when the voltage of the semiconductor base 7 is Vb. Thus, the substantial capacitive coupling between the word line WL and the semiconductor base 7 occurs only when the voltage of the word line WL becomes equal to or lower than $Vt_{WL}$ "1" and drops to Vss. As a result, the voltage of the semiconductor base 7 becomes $Vb-\beta_{WL}\times Vt_{WL}$ "1". Here, $Vt_{WL}$ "1" is lower than $Vt_{WL}$ "$_0$", and $\beta_{WL}\times Vt_{WL}$ "1" is small.

The write operation of the dynamic flash memory cell will be further described with reference to FIG. 3B. From time T8 to time T9, the voltage of the bit line BL drops from $V_{BLH}$ to Vss. Because the bit line BL and the semiconductor base 7 are capacitively coupled to each other, the "1" write voltage $V_{FB}$ "1" of the semiconductor base 7 finally becomes the following.

$$V_{FB}\text{"1"}=Vb-\beta_{WL}\times Vt_{WL}\text{"1"}-\beta_{BL}\times V_{BLH} \quad (7)$$

Here, the coupling ratio $\beta_{BL}$ between the bit line BL and the semiconductor base 7 is also small. Accordingly, as illustrated in FIG. 3D, the threshold voltage of the second N-channel MOS transistor region of the second channel Si layer 7*b* connected to the word line WL decreases. A memory write operation (an example of "memory write operation" in the claims) is performed with the "1" write state of the semiconductor base 7 being a first data retention voltage (an example of "first data retention voltage" in the claims), and is assigned to logical storage data "1".

At the time of the write operation, in a second boundary region between the first impurity region 3*a* and the first channel Si layer 7*a* or a third boundary region between the second impurity region 3*b* and the second channel Si layer 7*b* instead of the first boundary region, electron-hole pairs may be generated by an impact ionization phenomenon, and the semiconductor base 7 may be charged with the generated positive hole group 9.

The above-described conditions of the voltages applied to the bit line BL, the source line SL, the word line WL, and the plate line PL are examples for performing a write operation. Other operation conditions for performing a write operation may be used.

The mechanism of a memory erase operation (an example of "memory erase operation" in the claims) will be described with reference to FIGS. 4AA to 4AC and FIG. 4B. The semiconductor base 7 between the $N^+$ layers 3*a* and 3*b* is electrically isolated from the substrate 1 and serves as a floating body. FIG. 4AA illustrates a state in which the positive hole group 9 generated by a gate-induced drain leakage current in the previous cycle is stored in the semiconductor base 7 before an erase operation. As illustrated in FIG. 4AB, the voltage of the source line SL is set to a negative voltage $V_{ERA}$ at the time of the erase operation. Here, $V_{ERA}$ is −3 V, for example. As a result, the PN junction between the semiconductor base 7 and the $N^+$ layer 3*a* serving as the source connected to the source line SL is forward biased, regardless of the value of an initial potential of the semiconductor base 7. As a result, the positive hole group 9 generated by a gate-induced drain leakage current in the previous cycle and stored in the semiconductor base 7 is absorbed into the $N^+$ layer 3*a* serving as the source, and the voltage $V_{FB}$ of the semiconductor base 7 becomes $V_{FB}=V_{ERA}+Vb$. This voltage value is a second data retention voltage (an example of "second data retention voltage" in the claims). Here, Vb is a built-in voltage of the PN junction and is about 0.7 V. Thus, when $V_{ERA}=-3$ V holds, the potential of the semiconductor base 7 is −2.3 V. This value corresponds to the potential state of the semiconductor base 7 in an erase state. Thus, when the potential of the semiconductor base 7 of the floating body becomes a negative voltage, the threshold voltage of the N-channel MOS transistor region increases due to a substrate bias effect.

Accordingly, the threshold voltage of the second gate conductor layer 5*b* connected to the word line WL increases as illustrated in FIG. 4AC. The erase state in the semiconductor base 7 corresponds to logical storage data "0". In data reading, the voltage to be applied to the first gate conductor layer 5*a* connected to the plate line PL is set to be higher than the threshold voltage at the time of logical storage data "1" and lower than the threshold voltage at the time of logical storage data "0", and thereby a characteristic is obtained in which no current flows even if the voltage of the word line WL is increased. FIG. 4B illustrates an example of voltage conditions of individual main node contacts at the time of the above-described erase operation. Upon the memory erase operation being finished, the source line SL returns to 0 V. As a result, the first PN junction and the second PN junction are both reverse-biased, and the voltage $V_{FB}$ of the semiconductor base 7 is retained.

The above-described conditions of the voltages applied to the bit line BL, the source line SL, the word line WL, and the plate line PL are examples for performing an erase operation, and other operation conditions for performing the erase operation may be used.

FIGS. 5A to 5C are diagrams for describing a read operation of the dynamic flash memory cell according to the first embodiment of the present invention. As illustrated in FIG. 5A, upon the semiconductor base 7 being charged to the built-in voltage Vb (about 0.7 V), the threshold voltage of the second N-channel MOS transistor region including the second gate conductor layer 5*b* connected to the word line WL is decreased by a substrate bias effect. This state is assigned to logical storage data "1". As illustrated in FIG. 5B, the memory block selected before writing is in an erase state "0" in advance, and the voltage $V_1S$ of the semiconductor base 7 is $V_{FB}$ "0". A write operation causes a write state "1" to be randomly stored. As a result, logical storage data of the logic "0" and "1" is generated for the word line WL. As illustrated in FIG. 5C, reading is performed by a sense amplifier by using a difference between two threshold voltages for the word line WL.

The above-described conditions of the voltages applied to the bit line BL, the source line SL, the word line WL, and the plate line PL are examples for performing a read operation, and other operation conditions for performing the read operation may be used.

A block erase operation will be described with reference to FIGS. 6AA to 6AD and FIG. 6B.

Figure 6A:
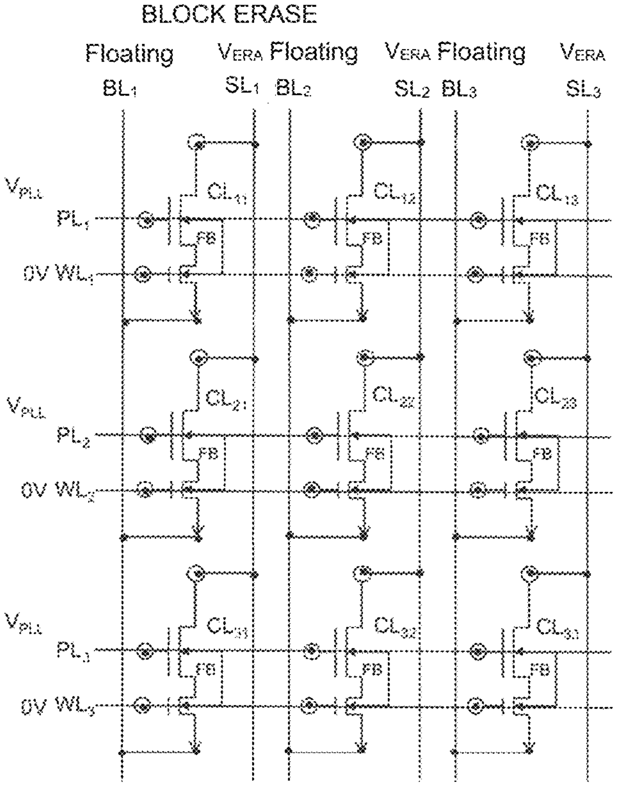
FIGS. 6AA, 6AB, 6AC, and 6AD are diagrams for describing a block erase operation of the memory device including an SGT according to the first embodiment.
Figure 6A:
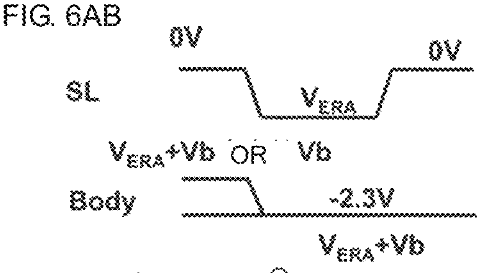
Figure 6A:
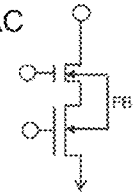
Figure 6A:
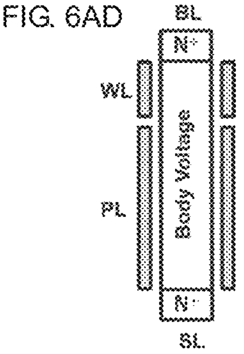

FIG. 6AA illustrates a circuit diagram of a memory block selected for block erase. Here, for convenience of description, a memory block formed of nine memory cells $CL_{11}$ to $CL_{33}$ in three rows and three columns is illustrated, but an actual memory block is larger than this matrix. Source lines $SL_1$ to $SL_3$, bit lines $BL_1$ to $BL_3$, plate lines $PL_1$ to $PL_3$, and word lines $WL_1$ to $WL_3$ are connected to the respective memory cells. As illustrated in FIGS. 6AB to 6AD and FIG. 6B, an erase voltage $V_{ERA}$ is applied to the source lines $SL_1$ to $SL_3$ of the memory block selected for block erase. At this time, the bit lines $BL_1$ to $BL_3$ are at Vss, and the word lines $WL_1$ to $WL_3$ are at Vss. For example, Vss is 0 V. In addition, although the fixed voltage $V_{LL}$ is applied to the plate lines $PL_1$ to $PL_3$ regardless of whether being selected for block erase, the voltage $V_{PLL}$ may be applied to the plate lines $PL_1$ to $PL_3$ of the selected block, and the voltage Vss may be applied to the plate lines $PL_1$ to $PL_3$ of the non-selected block. As a result of such control of the voltage setting of the signal lines, all the logical storage data "1" and "0" accumulated in the floating body FB of each memory cell become "0". Thus, the logical storage data may be either the write state "1" or the erase state "0". The potential of the semiconductor base 7 of the floating body in the erase state "0" is $V_{ERA}$+Vb. For example, when $V_{ERA}$=−3 V and Vb=0.7 V, the potential of the semiconductor base 7 of the floating body is −2.3 V. Vb represents a built-in voltage of the PN junction between the $N^+$ layer as a source line SL and the semiconductor base 7 of the floating body, and is about 0.7 V. When the semiconductor base 7 is negatively biased to −2.3 V, the threshold voltage of the second N-channel MOS transistor region having input from the word line WL rises due to a back bias effect.

Furthermore, because erasing is performed in units of memory blocks, a cache memory for temporarily storing data in the memory blocks and a logical address/physical address conversion table of the memory blocks are necessary. These may be provided in the dynamic flash memory device or in a system handling the dynamic flash memory device.

A block rewrite operation and a block erase operation will be described with reference to FIGS. 7A to 7F.

FIG. 7A illustrates a logical/physical block address conversion lookup table (abbreviated as a logical/physical conversion table, an example of "logical/physical conversion table" in the claims) 32. The logical/physical conversion table 32 includes a logical address (an example of "logical address" in the claims) 41, an address conversion table (an example of "address conversion table" in the claims) 42, and a physical address (an example of "physical address" in the claims) 43. The address conversion table 42 is constituted by, for example, a semiconductor memory circuit using a dynamic flash memory cell designed with a high-speed specification and a logic circuit.

For example, in response to a logical address from a central processing unit (CPU), a graphics processing unit (GPU), or a micro-processing unit (MPU) being input to the address conversion table 42, a corresponding physical address is output. Conversely, in response to a physical address being input to the address conversion table 42, a corresponding logical address is output. Every time the physical address of the block to be rewritten in the dynamic flash memory device is changed, a correspondence table stored in the semiconductor memory circuit of the address conversion table is updated.

The logical address 41 constitutes a logical address space 44, and a memory erase operation, a memory write operation, and a memory read operation are performed for a logical block address 36 in the logical address space 44. The physical address 43 constitutes a physical address space 45, and a memory erase operation, a memory write operation, and a memory read operation are performed for a physical block address 37 in the physical address space 45.

The semiconductor element memory device according to the first embodiment of the present invention and the semiconductor memory device of the system including the logical/physical conversion table and a controller circuit are capable of replacing a DRAM constituted by a binary address space, and the logical address space 44 is constituted by a binary number. As described above, the memory device constitutes a system by hardware of dynamic flash memory cells and software of instructions from a CPU, a GPU, or an MPU and a logical/physical conversion table.

In addition, the semiconductor memory device constituted by the dynamic flash memory cells according to the first embodiment of the present invention performs a rewrite operation and an erase operation in units of blocks 35 (see FIGS. 7C to 7F), and thus the physical address space 45 constituted by the physical address 43 is larger than the logical address space 44 constituted by the logical address 41.

Figure 7B:
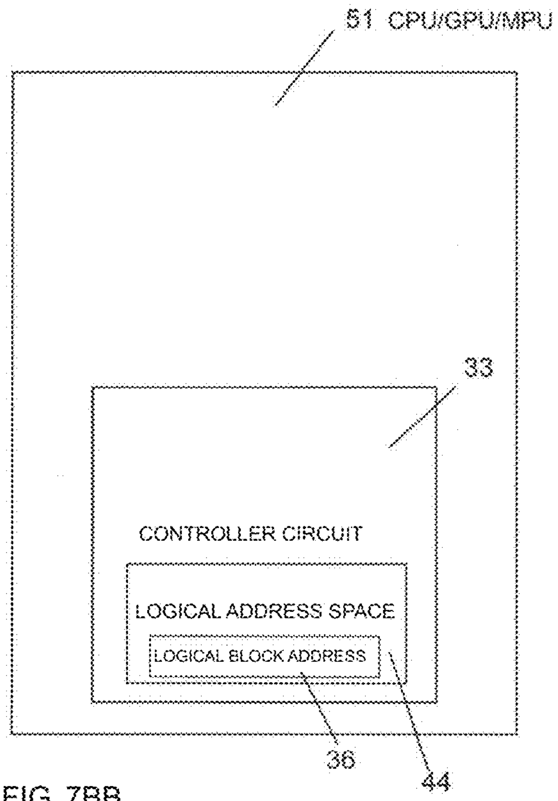
FIGS. 7BA and 7BB are diagrams for describing the block rewrite operation and the block erase operation of the memory device including an SGT according to the first embodiment.
Figure 7B:
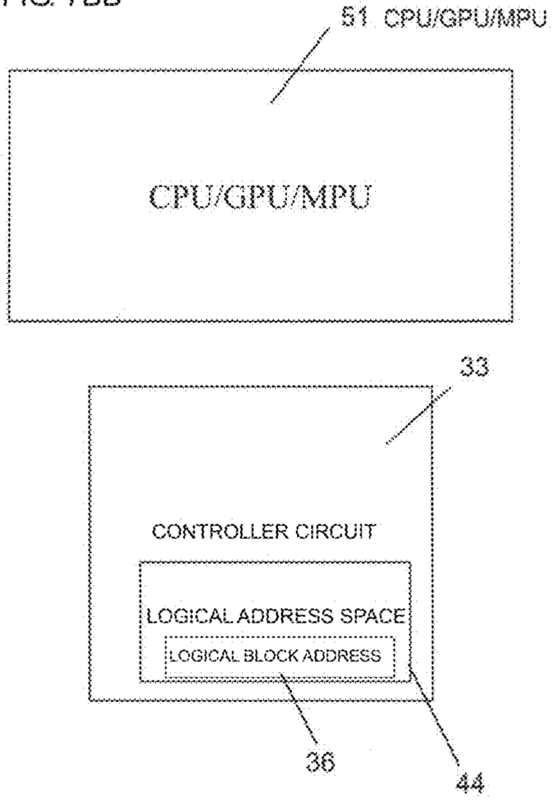

FIGS. 7BA and 7BB illustrate the relationship between a CPU/GPU/MPU 51 and a controller circuit (an example of "controller circuit" in the claims) 33. FIG. 7BA illustrates an example in which the controller circuit 33 is included in the CPU/GPU/MPU 51 and is mounted therewith. FIG. 7BB illustrates an example in which the controller circuit 33 is disposed separately from the chip of the CPU/GPU/MPU 51. In any case, the logical address space 44 is in the controller circuit 33, and the logical block address 36 is in the logical address space 44.

A block rewrite operation and a block erase operation of the dynamic flash memory cells according to the first embodiment will be described with reference to FIGS. 7C to 7F.

Figure 7C:
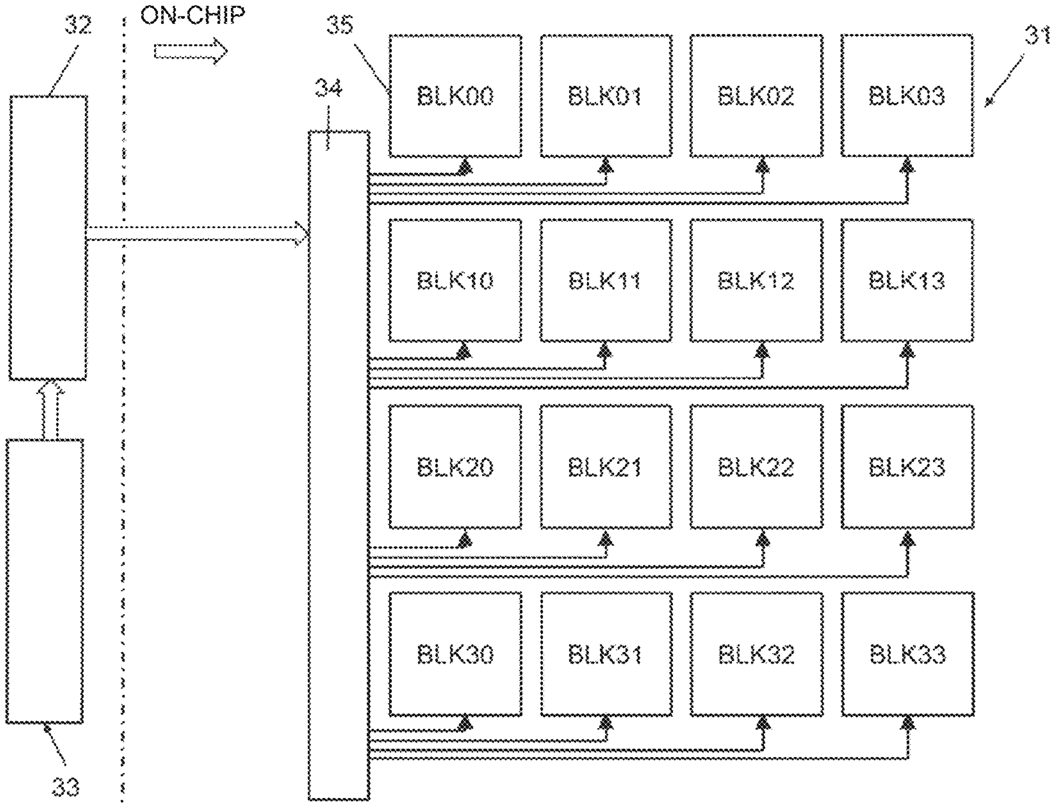
FIG. 7C is a diagram for describing the block rewrite operation and the block erase operation of the memory device including an SGT according to the first embodiment.

In FIG. 7C, the controller circuit 33 and the logical/physical conversion table 32 constantly manage which physical block address of the dynamic flash memory corresponds to data stored in a logical block address. This is because the correspondence between a logical block address and a physical block address needs to be constantly managed because data in a block is rewritten by using an already erased block in the dynamic flash memory, as in a flash memory. The controller circuit 33 and the logical/physical conversion table 32 may be provided in the chip of the dynamic flash memory, or may be provided outside the chip as illustrated in FIG. 7C. An instruction from the logical/physical conversion table 32 is input to a block address decoder circuit 34, and a block to be subjected to rewriting and a block to be subjected to erasing are selected from among blocks BLK00 to BLK33.

Figure 7D:
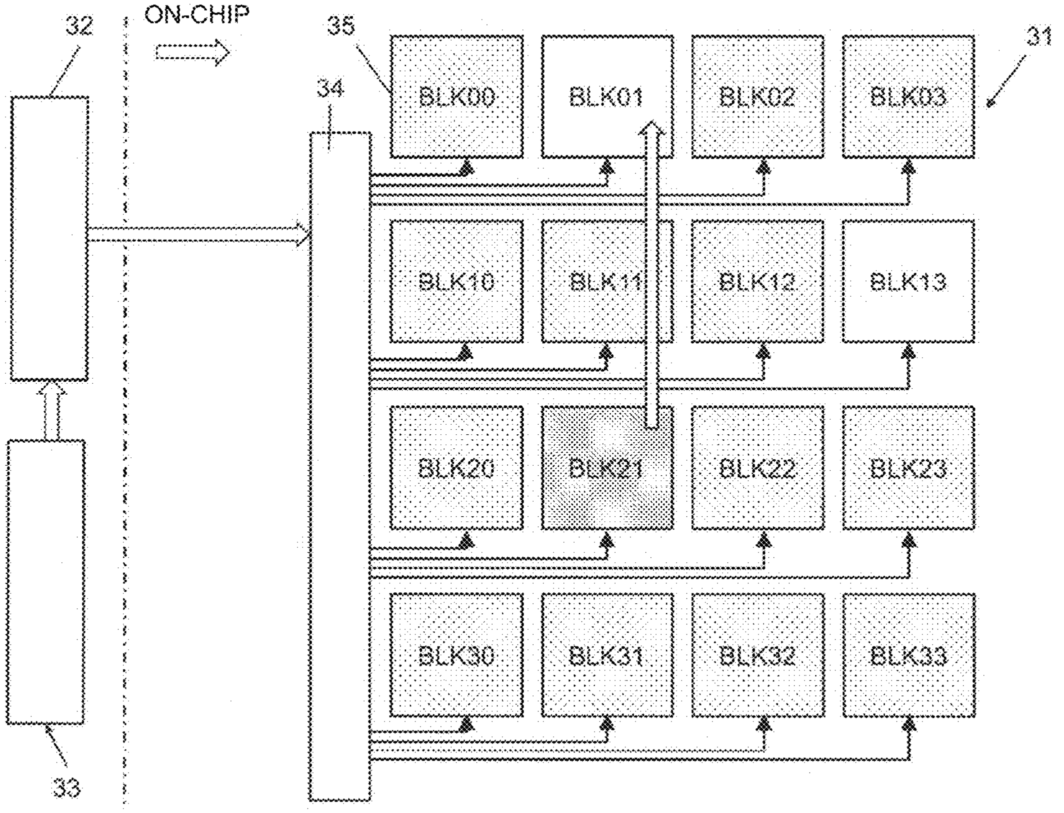
FIG. 7D is a diagram for describing the block rewrite operation and the block erase operation of the memory device including an SGT according to the first embodiment.
Figure 7E:
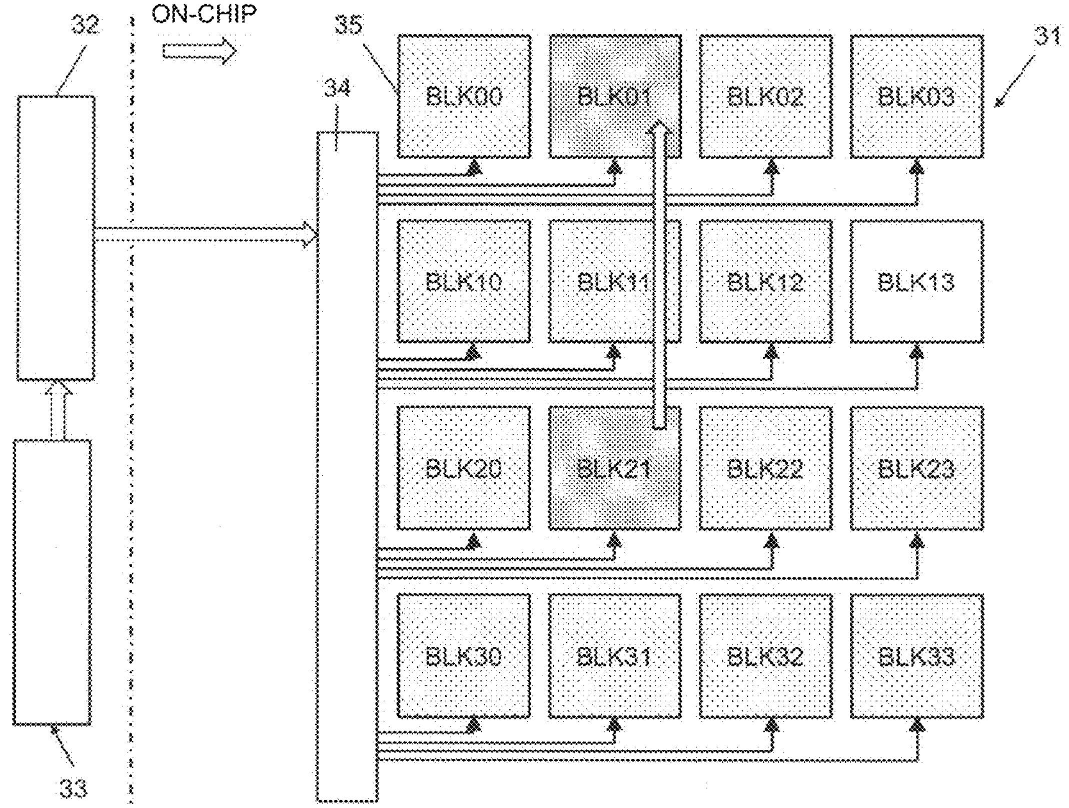
FIG. 7E is a diagram for describing the block rewrite operation and the block erase operation of the memory device including an SGT according to the first embodiment.
Figure 7F:
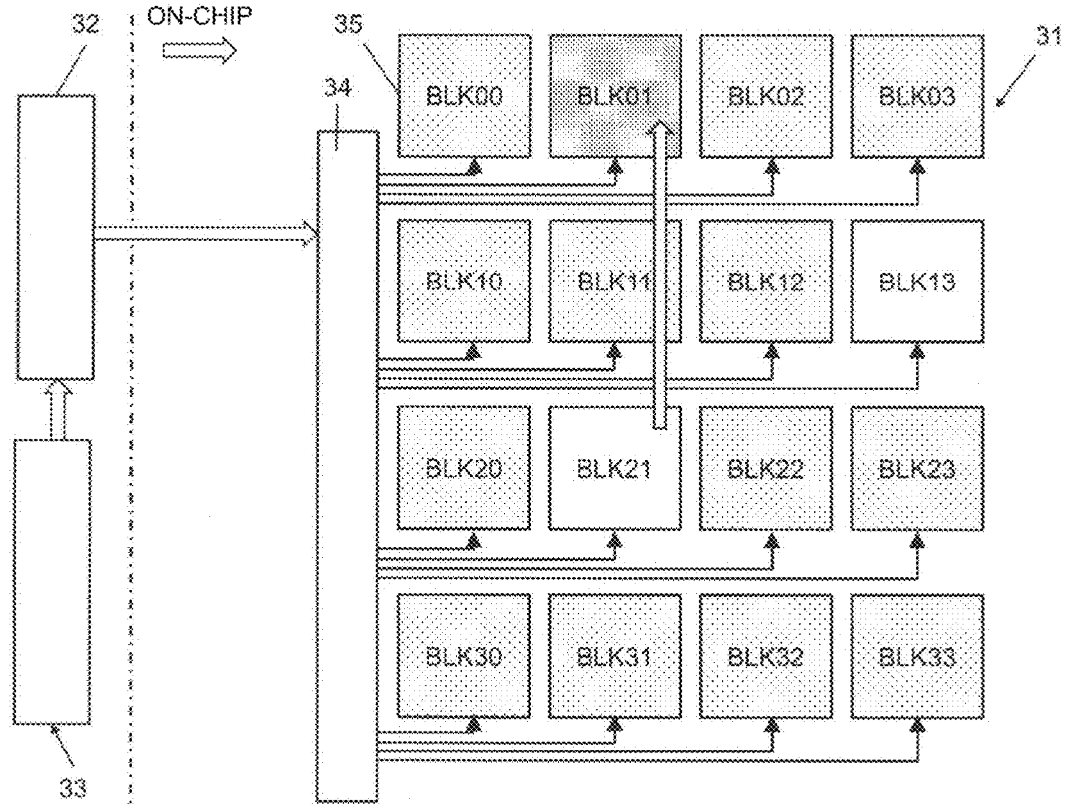
FIG. 7F is a diagram for describing the block rewrite operation and the block erase operation of the memory device including an SGT according to the first embodiment.
Figure 8A:
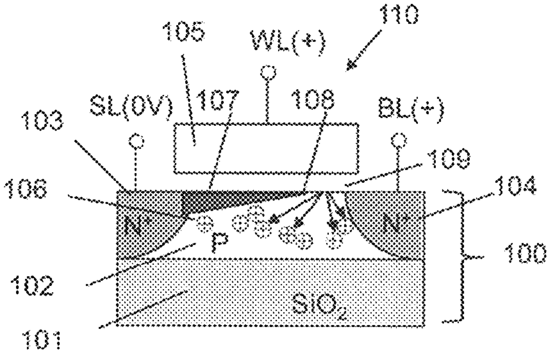
FIGS. 8A, 8B, 8C, and 8D are diagrams for describing a write operation of a capacitorless DRAM memory cell according to the related art.
Figure 8B:
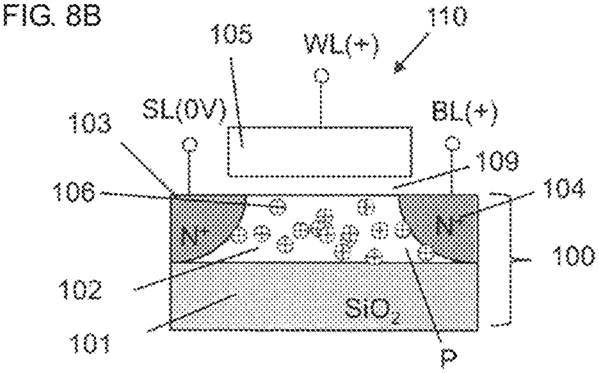
Figure 8C:
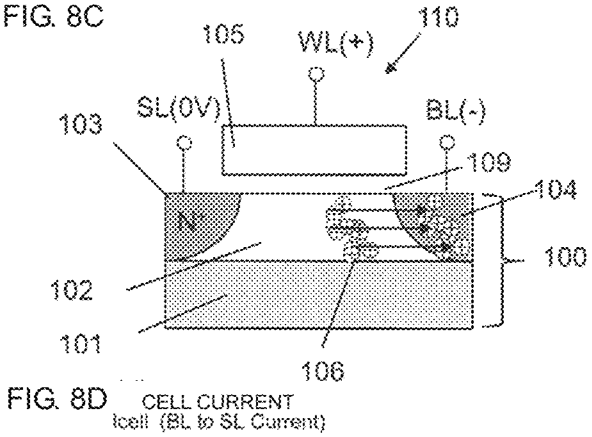
Figure 8D:
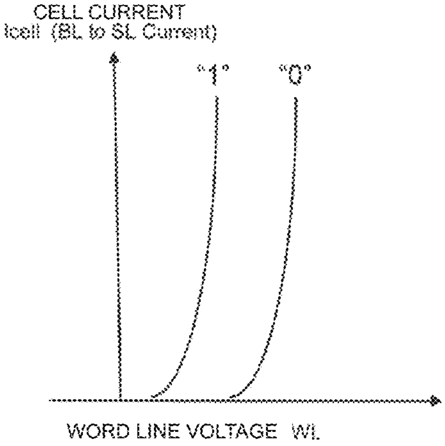
Figure 9A:
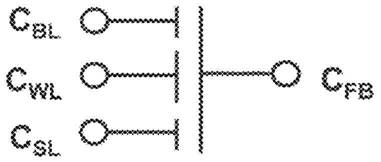
FIGS. 9A and 9B are diagrams for describing a problem in the operation of the capacitorless DRAM memory cell according to the related art.
Figure 9B:
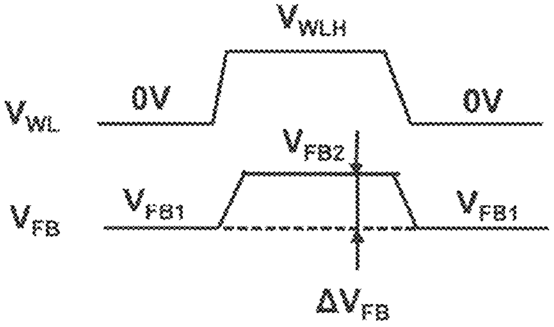
Figure 10A:
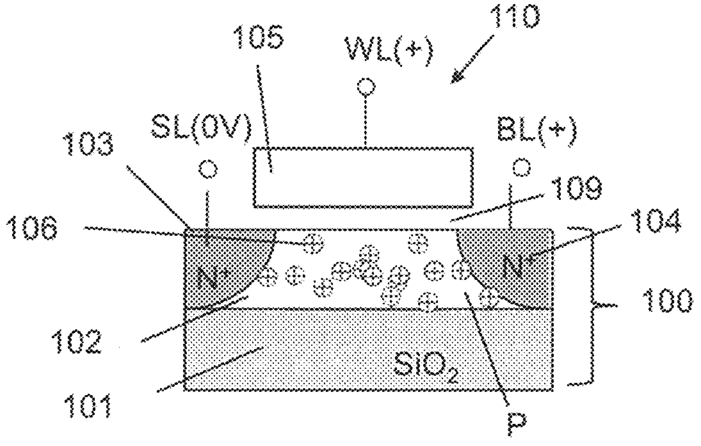
FIGS. 10A, 10B, and 10C are diagrams for describing a read operation of the capacitorless DRAM memory cell according to the related art.
Figure 10B:
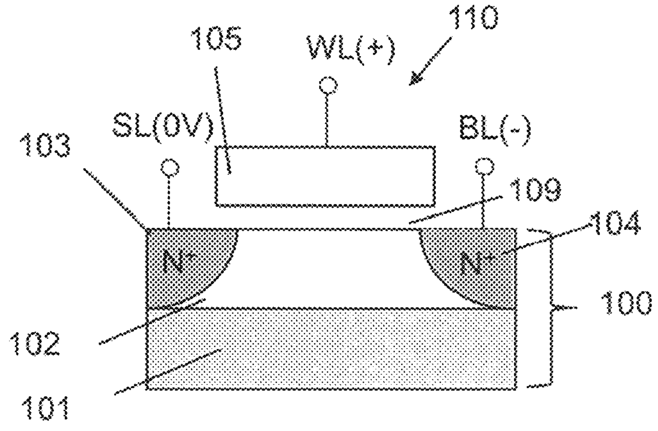
Figure 10C:
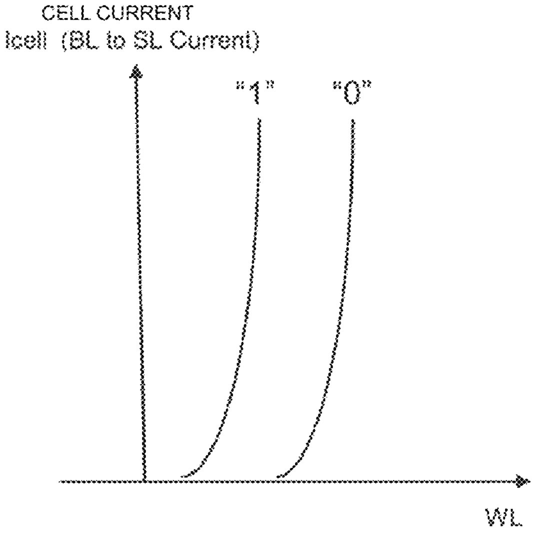

With reference to FIG. 7D, FIG. 7E, and FIG. 7F, an erase operation involved in rewriting of stored data will be described in detail. In FIG. 7D, of the 4×4=16 blocks of the blocks BLK00 to BLK33 of the dynamic flash memory, the blocks BLK01 and BLK13 are blocks from which data has already been erased, and the other blocks have data stored therein. For example, it is assumed that an instruction to rewrite the data stored in the block BLK21 is issued by the controller circuit 33. First, the controller circuit 33 refers to the logical/physical conversion table 32 to find which block is an erased block. Subsequently, the controller circuit 33 finds the desired erased block BLK01.

Thereafter, as illustrated in FIG. 7E, the data not to be rewritten in the block BLK21 to be rewritten is copied to the erased block BLK01, and the page data related to the word line WL to be rewritten is newly written in the block BLK01.

Thereafter, as illustrated in FIG. 7F, after the data has been copied from the block BLK21 to the block BLK01 and new data has been written in the block BLK01, the old data stored in the block BLK21 is erased. Subsequently, the physical block BLK01 is registered in the logical/physical conversion table 32 through the controller circuit 33.

In FIG. 7D, FIG. 7E, and FIG. 7F, after the one block BLK21 has been selected, the data has been copied from the block BLK21 to the block BLK01, and new data has been written in the block BLK01, the old data stored in the block BLK21 is erased. The block erase may be performed by simultaneously selecting at least one or more plural blocks.

In a flash memory, operations similar to the block rewriting and the block erasing described with reference to FIG. 7D, FIG. 7E, and FIG. 7F are performed. In the flash memory, in addition, a controller circuit monitors and manages the number of times of rewriting for each block. In the flash memory, a high electric field is applied to take in and out electrons stored in a storage node through a tunnel oxide film. Thus, the rewrite life of the tunnel oxide film is defined in the specification. In contrast, in the dynamic flash memory cell of the present embodiment, rewriting is performed at a much lower electric field than in the flash memory. Thus, it is not necessary to limit the number of times of rewriting for each block in terms of reliability.

In the block rewrite operation and the block erase operation described with reference to FIG. 7D, FIG. 7E, and FIG. 7F, a cache memory (not illustrated) for temporarily storing data stored in a block to be rewritten may be required. The cache memory may be provided inside or outside the chip of the dynamic flash memory of the present embodiment.

The logical/physical conversion table 32 or the cache memory may be constituted by a memory cell array in which dynamic flash memory cells can be accessed at high speed.

In addition, a refresh operation may be performed for each block in order to hold data stored in the block. In this case, refreshing is performed in the block of the physical address, and thus a block rewrite operation or a block erase operation need not be performed.

In FIG. 1, desirably, the length in the vertical direction of the first gate conductor layer 5*a* connected to the plate line PL is larger than the length in the vertical direction of the second gate conductor layer 5*b* connected to the word line WL, so that $C_{PL}>C_{WL}$ holds. However, only adding of the plate line PL decreases a coupling ratio $(C_{WL}/(C_{PL}+C_{WL}+C_{BL}+C_{SL}))$ of the capacitive coupling of the word line WL to the semiconductor base 7. As a result, the potential variation $\Delta V_{FB}$ of the semiconductor base 7 of the floating body reduces.

As the voltage $V_{PLL}$ of the plate line PL, a fixed voltage of 2 V may be applied, for example.

In FIG. 1, the Si pillar 2 may have a horizontal sectional shape that is circular, elliptical, or rectangular, so as to perform the dynamic flash memory operation described in the present embodiment. Circular, elliptical, and rectangular dynamic flash memory cells may be disposed together on the same chip.

A dynamic flash memory element has been described with reference to FIG. 1 by taking, as an example, the SGT in which the first gate insulating layer 4*a* and the second gate insulating layer 4*b* are disposed so as to surround the entire side surface of the Si pillar 2 standing in the vertical direction on the substrate 1, and the first gate conductor layer 5*a* and the second gate conductor layer 5*b* are disposed so as to surround the entire side surfaces of first gate insulating layer 4*a* and second gate insulating layer 4*b*. As described in the present embodiment, the dynamic flash memory element may have any structure as long as it satisfies the condition that the positive hole group 9 generated by an impact ionization phenomenon is held in the semiconductor base 7. For this purpose, the semiconductor base 7 may have a floating body structure isolated from the substrate 1. Thus, the dynamic flash memory operation described above can be performed even when the semiconductor base is formed horizontally with respect to the substrate 1 by using, for example, a GAA (Gate All Around: see, for example, E. Yoshida and T. Tanaka: "A Design of Capacitorless 1T-DRAM Cell Using Gate-Induced Drain-Leakage (GIDL) Current for Low-Power and High-Speed Embedded Memory," IEEE IEDM (2006)) technique, which is one of SGTs, and a nanosheet technique (see, for example, J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186 to 191, May 2006). Alternatively, a device structure using silicon on insulator (SOI) (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2003); and E. Yoshida and T. Tanaka: "A Design of Capacitorless 1T-DRAM Cell Using Gate-Induced Drain-Leakage (GIDL) Current for Low-Power and High-Speed Embedded Memory," IEEE IEDM (2006)) may be used. In this device structure, the bottom portion of a semiconductor base is in contact with an insulating layer of an SOI substrate, and another semiconductor base is surrounded by a gate insulating layer and an element isolation insulating layer. Also in this structure, the semiconductor base has a floating body structure. As described above, in the dynamic flash memory element provided by the present embodiment, it is sufficient that the semiconductor base have a floating body structure. Even in a structure in which a Fin transistor (see, for example, H. Jiang, N. Xu, B. Chen, L. Zeng1, Y. He, G. Du, X. Liu and X. Zhang: "Experimental investigation of self-heating effect (SHE) in multiple-fin SOI FinFETs," Semicond. Sci. Technol. 29 (2014) 115021 (7pp)) is formed on an SOI substrate, the dynamic flash operation can be performed as long as the semiconductor base has a floating body structure.

In "1" writing, electron-hole pairs may be generated by using a gate-induced drain leakage (GIDL) current (see, for example, E. Yoshida and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006), and the semiconductor base 7 may be filled with the generated positive hole group.

Equations (1) to (10) in the present specification and drawings are used for qualitatively describing phenomena, and the phenomena are not limited by these equations.

In FIG. 3B, the reset voltages of the word line WL, the bit line BL, and the source line SL are denoted by Vss; however, these voltages may be different voltages.

FIG. 4B illustrates an example of erase operation conditions. In contrast to this, the voltages to be applied to the source line SL, the plate line PL, the bit line BL, and the word line WL may be changed as long as the positive hole group 9 in the semiconductor base 7 can be discharged from either or both of the $N^+$ layer 3*a* and the $N^+$ layer 3*b*. In a block erase operation, an erase voltage may be applied to the source line SL of a selected block, and the bit line BL may be brought into a floating state.

In FIG. 1, in the semiconductor base 7 at a portion surrounded by the insulating layer 6 serving as a first insulating layer, the potential distributions of the first channel Si layer 7*a* and the second channel Si layer 7*b* are connected to each other in the vertical direction. Accordingly, the semiconductor base 7 of the first channel Si layer 7*a* and the second channel Si layer 7*b* is continuous in the region surrounded by the insulating layer 6 serving as a first insulating layer in the vertical direction.

In FIG. 1, the first gate conductor layer 5*a* may be divided into two or more portions in plan view or in the vertical direction, and the individual portions may be operated synchronously or asynchronously as conductor electrodes of plate lines at the same driving voltage or different driving voltages. Similarly, the second gate conductor layer 5*b* may be divided into two or more portions in plan view or in the vertical direction, and the individual portions may be operated synchronously or asynchronously as conductor electrodes of word lines at the same driving voltage or different driving voltages. Accordingly, the dynamic flash memory operation can be performed. In a case where the first gate conductor layer 5*a* is divided into two or more portions, at least one of the portions implements the function of the first gate conductor layer 5*a*. Also in the divided second gate conductor layer 5*b*, at least one of the portions implements the function of the second gate conductor layer 5*b*. In the vertical direction, isolated gate conductor layers of one of the first gate conductor layer 5*a* and the second gate conductor layer 5*b* may be arranged on both sides of the other of the first gate conductor layer 5*a* and the second gate conductor layer 5*b*.

The conditions of voltages to be applied to the bit line BL, the source line SL, the word line WL, and the plate line PL and the voltage of the floating body are examples for performing basic operations of an erase operation, a write operation, and a read operation, and other voltage conditions may be used as long as the basic operations of the present invention can be performed.

In FIG. 1, the first gate conductor layer 5*a* may be connected to the word line WL, and the second gate conductor layer 5*b* may be connected to the plate line PL. Also with this configuration, the above-described dynamic flash memory operation can be performed.

A junctionless structure may be used in which the $N^+$ layers 3*a* and 3*b* and the semiconductor base 7 as a P layer have the same conductivity in the dynamic flash memory cell illustrated in FIG. 1. The same applies to other embodiments.

The present embodiment provides the following features.

Feature 1

In the dynamic flash memory cell of the present embodiment, the $N^+$ layers 3*a* and 3*b* serving as the source and drain, the semiconductor base 7, the first gate insulating layer 4*a*, the second gate insulating layer 4*b*, the first gate conductor layer 5*a*, and the second gate conductor layer 5*b* are formed in a pillar shape as a whole. The $N^+$ layer 3*a* serving as the source is connected to the source line SL, the $N^+$ layer 3*b* serving as the drain is connected to the bit line BL, the first gate conductor layer 5*a* is connected to the plate line PL, and the second gate conductor layer 5*b* is connected to the word line WL. In this structure, the gate capacitance of the first gate conductor layer 5*a* connected to the plate line PL is larger than the gate capacitance of the second gate conductor layer 5*b* connected to the word line WL. In this dynamic flash memory cell, the first gate conductor layer 5*a* and the second gate conductor layer 5*b* are stacked in the vertical direction. Thus, even in the structure in which the gate capacitance of the first gate conductor layer 5*a* connected to the plate line PL is larger than the gate capacitance of the second gate conductor layer 5*b* connected to the word line WL, the memory cell area is not large in plan view. Accordingly, a higher performance and a higher degree of integration of the dynamic flash memory cells can be simultaneously realized. In data reading, the voltage to be applied to the first gate conductor layer 5*a* connected to the plate line PL is set to be higher than the threshold voltage at the time of logical storage data "1" and lower than the threshold voltage at the time of logical storage data "0", and thereby a characteristic is obtained in which no current flows even if the voltage of the word line WL is increased. This leads to a further increase in the operation margin of the dynamic flash memory cell.

Feature 2

The semiconductor memory device constituted by the dynamic flash memory cells according to the first embodiment of the present invention performs rewrite and erase operations in units of the blocks 35, and thus the physical address space 45 constituted by the physical address 43 is larger than the logical address space 44 constituted by the logical address 41. As a result, it is possible to have a large number of erased blocks 35, and it is possible to cope with consecutive data rewrite instructions from the CPU/GPU/MPU 51 at a sufficiently high speed.

Feature 3

The logical address space 44 of the semiconductor memory device constituted by the dynamic flash memory cells according to the first embodiment of the present invention is constituted by a binary number. The semiconductor memory device constituted by the dynamic flash memory cells is capable of easily replacing a DRAM.

Feature 4

The dynamic flash memory cell according to the first embodiment of the present invention, which is a volatile memory, is capable of implementing a block rewrite operation and a block erase operation, which are functions executable only by a flash memory as a nonvolatile memory in the related art, and achieving a higher degree of integration.

Feature 5

In the dynamic flash memory cell according to the first embodiment of the present invention, the source line SL and the other control lines including the word line WL, the bit line BL, and the plate line PL can be controlled independently for each block. Thus, it is possible to easily select a block to be subjected to erasing and a block not to be subjected to erasing, and only the data in the target block can be erased.

Feature 6

In the dynamic flash memory cell according to the first embodiment of the present invention, a negative voltage is applied to the source line SL at the time of erasing, but the bit line BL can be kept in a floating state without a specific DC voltage being applied thereto. As a result, no current flows from the bit line BL to the source line SL. The erase voltage $V_{ERA}$ is applied to the source line SL and the voltage $V_{FB}$ of the semiconductor base 7 is $V_{FB}=V_{ERA}+Vb$. Thus, the PN junction between the semiconductor base 7 of the P layer and the $N^+$ layer of the bit line BL is in a reverse bias state. Thus, for example, it is not necessary to apply the negative voltage of the erase voltage $V_{ERA}$ to the bit line BL. As a result, a circuit connected to the bit line BL, for example, a buffer circuit for protecting a sense amplifier circuit by blocking a negative voltage between the sense amplifier circuit and the bit line BL, is not necessary, and the circuit can be designed very easily. In addition, the absence of the buffer circuit makes it possible to reduce the chip area accordingly, and provide a dynamic flash memory at low cost. Furthermore, the absence of the buffer circuit enables the sense amplifier circuit to perform a high-speed sensing operation.

Feature 7

Focusing on the role of the first gate conductor layer 5*a* connected to the plate line PL of the dynamic flash memory cell according to the first embodiment of the present invention, the voltage of the word line WL oscillates up and down when the dynamic flash memory cell performs a write or read operation. At this time, the plate line PL functions to reduce the capacitive coupling ratio between the word line WL and the semiconductor base 7. As a result, when the voltage of the word line WL oscillates up and down, an influence of the voltage change in the semiconductor base 7 can be significantly reduced. This makes it possible to increase the difference in the threshold voltage of the SGT of the word line WL indicating the logic "0" and "1". This leads to an increase in the operation margin of the dynamic flash memory cell.

OTHER EMBODIMENTS

Although a Si pillar is formed in the present invention, a semiconductor pillar made of a semiconductor material other than Si may be used. The same applies to other embodiments according to the present invention.

In a vertical NAND flash memory circuit, a plurality of memory cells are formed in the vertical direction. Each memory cell includes a semiconductor pillar serving as a channel, and a tunnel oxide layer, a charge storage layer, an interlayer insulating layer, and a control conductor layer that surround the semiconductor pillar. The semiconductor pillars at both ends of these memory cells include a source line impurity region corresponding to a source and a bit line impurity region corresponding to a drain. For one memory cell, when one of the memory cells on both sides of the one memory cell is a source, the other serves as a drain. Thus, the vertical NAND flash memory circuit is one of the SGT circuits. Thus, the present invention can also be applied to a mixed circuit with a NAND flash memory circuit.

In "1" writing, electron-hole pairs may be generated by an impact ionization phenomenon using a gate-induced drain leakage (GIDL) current described in E. Yoshida and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006, and the floating body FB may be filled with the generated positive hole group. The same applies to other embodiments according to the present invention.

In FIG. 1, also with a structure in which the polarities of the conductivity types of the $N^4$ layers 3*a* and 3*b* and the P layer Si pillar 2 are reversed, the dynamic flash memory operation is performed. In this case, the majority carriers are electrons in the Si pillar 2 of N-type. Thus, a group of electrons generated by impact ionization is stored in the semiconductor base 7, and a "1" state is set.

In the present invention, various embodiments and modifications can be made without departing from the broad spirit and scope of the present invention. The above-described embodiment is for explaining an example of the present invention, and does not limit the scope of the present invention. The above-described embodiment and modifications can be combined as appropriate. Furthermore, the above-described embodiment from which one or some of the constituent elements are removed as appropriate is also within the scope of the technical idea of the present invention.

According to a memory device including an SGT of the present invention, it is possible to obtain a dynamic flash memory which is a memory device including a high-density and high-performance SGT.

What is claimed is:

1. A semiconductor element memory device comprising:

a block of semiconductor memory cells arranged in a matrix, each semiconductor memory cell including:

a semiconductor base standing on a substrate in a vertical direction with respect to the substrate or extending on the substrate in a horizontal direction with respect to the substrate, wherein the semiconductor base has a longitudinal length and has first and second ends located at ends of the longitudinal length, and further wherein the semiconductor base forms a floating body doped to have a single conductivity type throughout the longitudinal length of the semiconductor base, and the floating body includes first and second channels arranged along the longitudinal direction of the semiconductor base;

a first impurity region and a second impurity region provided, respectively, at the first and second ends of the semiconductor base, wherein the first and second impurity regions are doped to have an identical conductivity type;

a gate insulating layer formed to extend in the longitudinal direction of the semiconductor base and at least partially circumferentially cover the semiconductor base between the first impurity region and the second impurity region;

a first gate conductor layer formed to at least partially circumferentially cover the gate insulating layer over the first channel of the floating body; and a second gate conductor layer formed, in separation from the first gate conductor layer, to at least partially circumferentially cover the gate insulating layer over the second channel of the floating body, wherein the semiconductor element memory device is configured to control voltages to be applied to the first gate conductor layer, the second gate conductor layer, the first impurity region, and the second impurity region to hold, inside the semiconductor base, a positive hole group formed by an impact ionization phenomenon or a gate-induced drain leakage current, perform a memory write operation of causing the semiconductor base to have a first data retention voltage, perform a memory erase operation of controlling voltages to be applied to the first impurity region, the second impurity region, the first gate conductor layer, and the second gate conductor layer to discharge a residual positive hole group of the positive hole group from either or both of the first impurity region and the second impurity region and to cause the semiconductor base to have a second data retention voltage lower than the first data retention voltage, perform, during the memory erase operation, a block erase operation on all the semiconductor bases in the block, the block erase operation being an operation of discharging the positive hole group from either or both of the first impurity region and the second impurity region, and mutually convert a physical address and a logical address of the block by using a logical/physical conversion table provided inside or outside the semiconductor element memory device.

2. The semiconductor element memory device according to claim 1, comprising: a physical address space constituted by the physical address; and a logical address space constituted by the logical address, wherein the physical address space is larger than the logical address space.

3. The semiconductor element memory device according to claim 2, wherein the logical address space is constituted by a binary number.

4. The semiconductor element memory device according to claim 1, wherein the logical/physical conversion table is constituted by the logical address, an address conversion table, and the physical address.

5. The semiconductor element memory device according to claim 1, wherein the logical/physical conversion table is managed by a controller circuit, and either or both of the logical/physical conversion table and the controller circuit are provided inside or outside the semiconductor element memory device.

6. The semiconductor element memory device according to claim 2, wherein rewriting of data in a first block of the logical address space is performed for a second block having a physical address different from a physical address of the first block, and the second block having the physical address is registered, in the logical/physical conversion table, as a new first block of the logical address space.

7. The semiconductor element memory device according to claim 1, wherein in each semiconductor memory cell included in the block, a source line is connected to the first impurity region, a bit line is connected to the second impurity region, a word line is connected to one of the first gate conductor layer and the second gate conductor layer, and a first drive control line is connected to the other of the first gate conductor layer and the second gate conductor layer, and the semiconductor element memory device is configured to selectively perform the memory erase operation and the memory write operation by applying voltages to the source line, the bit line, the first drive control line, and the word line.

8. The semiconductor element memory device according to claim 7, wherein in each semiconductor memory cell included in the block, the bit line is orthogonal to the word line in plan view.

9. The semiconductor element memory device according to claim 1, wherein in each semiconductor memory cell included in the block, a first gate capacitance between the first gate conductor layer and the semiconductor base is larger than a second gate capacitance between the second gate conductor layer and the semiconductor base.

10. The semiconductor element memory device according to claim 9, wherein the first and second gate conductor layers have longitudinal lengths different from each other so that the first gate capacitance is larger than the second gate capacitance.

11. The semiconductor element memory device according to claim 1, wherein in each semiconductor memory cell included in the block, the semiconductor base is formed perpendicular to the substrate, the first impurity region is formed in the semiconductor base near the substrate, a first semiconductor base is formed in the semiconductor base above the first impurity region, a second semiconductor base is formed in the semiconductor base above the first semiconductor base, the second impurity region is formed in the semiconductor base above the second semiconductor base, a first gate insulating layer is formed to surround the first semiconductor base, a second gate insulating layer is formed to surround the second semiconductor base, the first gate conductor layer is formed to surround the first gate insulating layer, the second gate conductor layer is formed to surround the second gate insulating layer, and a first insulating layer is disposed between the first gate conductor layer and the second gate conductor layer.

12. The semiconductor element memory device according to claim 1, wherein at least one of the first gate conductor layer and the second gate conductor layer is divided into two or more isolated gate conductor layers in plan view or in the vertical direction, and the isolated gate conductor layers are operated synchronously or asynchronously.

13. The semiconductor element memory device according to claim 12, wherein the isolated gate conductor layers of one of the first gate conductor layer and the second gate conductor layer are disposed along the longitudinal length of the semiconductor base on both sides of the other of the first gate conductor layer and the second gate conductor layer.

14. The semiconductor element memory device according to claim 9, wherein the first and second gate insulating layers are formed to have thicknesses different from each other so that the first gate capacitance is larger than the second gate capacitance.

15. The semiconductor element memory device according to claim 9, wherein the first and second gate insulating layers are formed to have relative permittivities different form each other so that the first gate capacitance is larger than the second gate capacitance.

* * * * *